(12) United States Patent
Shang et al.

(10) Patent No.: US 11,751,450 B2
(45) Date of Patent: Sep. 5, 2023

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Yi Zhang, Beijing (CN); Tingliang Liu, Beijing (CN); Shun Zhang, Beijing (CN); Huijuan Yang, Beijing (CN); Linhong Han, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 244 days.

(21) Appl. No.: 17/418,519

(22) PCT Filed: Aug. 31, 2020

(86) PCT No.: PCT/CN2020/112646
§ 371 (c)(1),
(2) Date: Jun. 25, 2021

(87) PCT Pub. No.: WO2022/041227
PCT Pub. Date: Mar. 3, 2022

(65) Prior Publication Data
US 2022/0310751 A1    Sep. 29, 2022

(51) Int. Cl.
*H01L 27/32* (2006.01)
*H10K 59/131* (2023.01)
(Continued)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS 9,886,898 B2     2/2018   Xuan et al.
2017/0287996 A1  10/2017  Kim et al.
(Continued)

FOREIGN PATENT DOCUMENTS

CN    106952940 A    7/2017
CN    107275368 A    10/2017
(Continued)

OTHER PUBLICATIONS

Li-Rong et al., High speed gate driver circuit basd on metal oxide thin film transistors, China Acta. Phys. Sin., Oct. 15, 2015, vol. 65 No. 2, China Academic Journale Electronic Publishing House.
(Continued)

*Primary Examiner* — Stacy Khoo
(74) *Attorney, Agent, or Firm* — ArentFox Schiff LLP; Michael Fainberg

(57) ABSTRACT

Disclosed are a display panel and a display device. The display panel includes: a base substrate and a plurality of sub-pixels located on the base substrate; and each sub-pixel includes: a semiconductor layer located on the base substrate and including a first active layer of an initialization transistor, a second active layer of a reset transistor and a third active layer of a data writing transistor; a first conductive layer located on a side of the semiconductor layer and including a data signal line extending in a first direction; and a second conductive layer located on the base substrate and including a drive gate of a drive transistor; and an orthographic projection of the second active layer on the base substrate is located between an orthographic projection of
(Continued)

the first active layer on the base substrate and an orthographic projection of the data signal line on the base substrate.

13 Claims, 18 Drawing Sheets

(51) Int. Cl.
*G09G 3/3233* (2016.01)
*H10K 59/126* (2023.01)
(52) U.S. Cl.
CPC .............. *G09G 2300/0819* (2013.01); *G09G 2300/0842* (2013.01); *G09G 2300/0861* (2013.01); *G09G 2310/08* (2013.01); *H10K 59/126* (2023.02)
(58) Field of Classification Search
CPC ... G09G 2300/0861; G09G 2310/0251; G09G 2310/08; H01L 27/1222; H01L 27/124; H10K 59/131; H10K 59/1213; H10K 59/126
See application file for complete search history.

(56) References Cited

U.S. PATENT DOCUMENTS

| | | |
|---|---|---|
| 2018/0315801 A1 | 11/2018 | Matsueda |
| 2020/0168686 A1 | 5/2020 | Han et al. |
| 2022/0310010 A1* | 9/2022 | Cheng ................. H10K 59/131 |

FOREIGN PATENT DOCUMENTS

| | | |
|---|---|---|
| CN | 108461504 A | 8/2018 |
| CN | 108807466 A | 11/2018 |
| CN | 109272930 A | 1/2019 |
| CN | 109785797 A | 5/2019 |
| CN | 111128080 A | 5/2020 |
| CN | 111508977 A | 8/2020 |
| EP | 3144924 A1 | 3/2017 |

OTHER PUBLICATIONS

Jung et al., Pixel Design Optimization of Fringe-Field Switching Mode for Applying Negative Liquid Crystals in High-Resolution Mobile Displays, Journal of Display Technology, Mar. 2015, vol. 11 No. 3, IEEE.

* cited by examiner

DISPLAY PANEL AND DISPLAY DEVICE

This disclosure is a US National Stage of International Application No. PCT/CN2020/112646, filed on Aug. 31, 2020, and entitled "DISPLAY PANEL AND DISPLAY DEVICE", the content of which is hereby incorporated by reference in its entirety.

FIELD

The present disclosure relates to the technical field of display, in particular to a display panel and a display device.

BACKGROUND

Organic Light Emitting Diode (OLED) display panels have advantages of self-illumination, wide viewing angle, high contrast, low power consumption, high reaction speed and so on, and have been more and more applied to various electronic devices.

With the continuous development of display technologies, people's demand for the display effect is also higher and higher. In recent years, high refresh frequency display products have gained more and more attention. However, for high refresh frequency display panels, the jump of data signals will affect gates of drive transistors, thus affecting the display effect.

SUMMARY

The embodiments of the present disclosure provide a display panel. The display panel includes: a base substrate, and a plurality of sub-pixels located on the base substrate.

Each of the plurality of sub-pixels includes: a semiconductor layer located on the base substrate and including: a first active layer of an initialization transistor, a second active layer of a reset transistor and a third active layer of a data writing transistor; a first conductive layer located on a side, facing away from the base substrate, of the semiconductor layer and including: a data signal line extending in a first direction; and a second conductive layer located on the base substrate and including: a drive gate of a drive transistor; where the drive gate is electrically connected to a first conductive region of the first active layer; the data signal line is electrically connected to a first conductive region of the third active layer; and an orthographic projection of the second active layer on the base substrate is located between an orthographic projection of the first active layer on the base substrate and an orthographic projection of the data signal line on the base substrate.

Optionally, in the embodiments of the present disclosure, an orthographic projection of a channel region of the second active layer on the base substrate is located between an orthographic projection of a channel region of the first active layer on the base substrate and the orthographic projection of the data signal line on the base substrate.

Optionally, in the embodiments of the present disclosure, the display panel further includes: a third conductive layer located on the base substrate; the third conductive layer includes: an initialization signal line extending in a second direction; and the second direction is intersected with the first direction; the initialization signal line is electrically connected with a first conductive region of the second active layer; and the first conductive region of the second active layer is located at an end, facing away from the first active layer, of the second active layer.

Optionally, in the embodiments of the present disclosure, the display panel further includes: a shielding structure located on the base substrate; and an orthographic projection of the shielding structure on the base substrate is located between an orthographic projection of the first conductive region of the first active layer on the base substrate and an orthographic projection of the first conductive region of the third active layer on the base substrate.

Optionally, in the embodiments of the present disclosure, the display panel further includes: a fourth conductive layer located on a side, facing away from the base substrate, of the semiconductor layer; the fourth conductive layer includes: a fixed potential signal line extending in the first direction; and the shielding structure is electrically connected to the fixed potential signal line.

Optionally, in the embodiments of the present disclosure, the shielding structure is disposed on the same layer as the initialization signal line.

Optionally, in the embodiments of the present disclosure, the third conductive layer further includes: a conductive connection structure connected to the shielding structure; and the fixed potential signal line is electrically connected to the shielding structure through the conductive connection structure.

Optionally, in the embodiments of the present disclosure, the fourth conductive layer further includes: a first conductive connection part, a second conductive connection part and a third conductive connection part which are insulated from one another; the drive gate is electrically connected to the first conductive region of the first active layer through the first conductive connection part; the data signal line is electrically connected to the first conductive region of the third active layer through the second conductive connection part; and the initialization signal line is electrically connected to the first conductive region of the second active layer through the third conductive connection part.

Optionally, in the embodiments of the present disclosure, the first active layer includes: a first bending part and a second bending part; one end of the first bending part is the first conductive region of the first active layer, and the other end of the first bending part is connected to the second bending part and bent towards one side facing away from the data signal line; and the second bending part is n-shaped, one end of the second bending part is connected to the first bending part, and the other end of the second bending part is connected to the second active layer.

Optionally, in the embodiments of the present disclosure, the second active layer includes: a first branch part and a second branch part; one end of the first branch part is the first conductive region of the second active layer, and the other end of the first branch part is connected to the second branch part; and the first branch part extends in the second direction and the second branch part extends in the first direction.

Optionally, in the embodiments of the present disclosure, the third active layer includes: a conductive protrusion part and a conductive extension part extending in the first direction; and one end of the conductive protrusion part is the first conductive region of the third active layer, and the other end of the conductive protrusion part is connected to the conductive extension part.

Optionally, in the embodiments of the present disclosure, the plurality of sub-pixels in the display panel are arrayed in the first direction and the second direction; the display panel includes a plurality of data signal lines, and the data signal lines are divided into first data signal lines and second data signal lines; and in each column of the sub-pixels, the sub-pixels of odd rows share one first data signal line, and the sub-pixels of even rows share one second data signal line.

Correspondingly, the embodiments of the present disclosure also provide a display device, including: the above-described display panel.

DETAILED DESCRIPTION OF THE EMBODIMENTS

Figure 1:
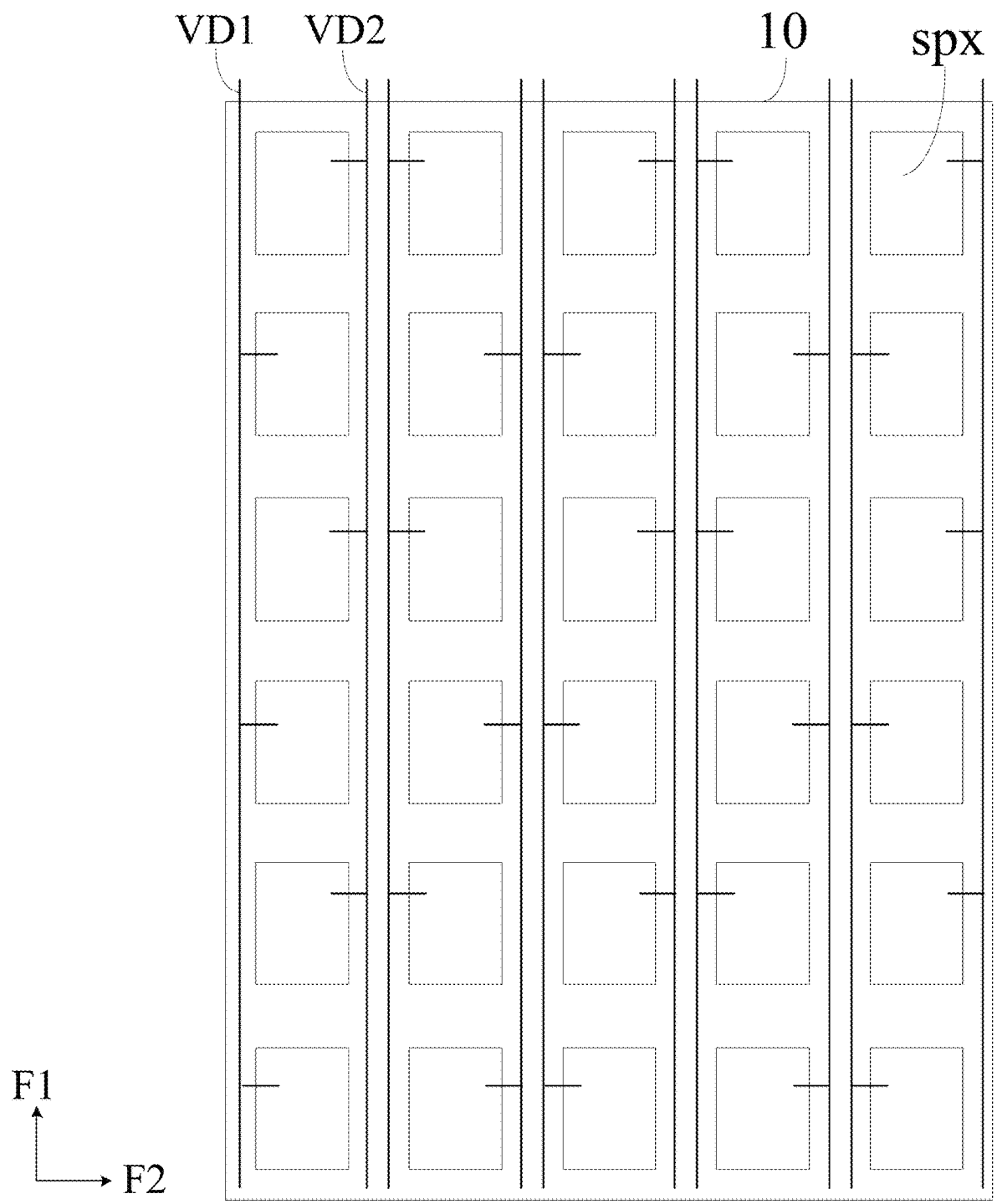
FIG. 1 is a schematic top view of a display panel provided according to an embodiment of the present disclosure.

In order to make the objectives, technical solutions, and advantages of the embodiments of the present disclosure clearer, the technical solutions of the embodiments of the present disclosure will be described clearly and completely in combination with the accompanying drawings of the embodiments of the present disclosure. It is to be understood that the described embodiments are some, but not all, embodiments of the present disclosure. Also, embodiments and features in the embodiments of the present disclosure may be combined with one another without conflict. Based on the described embodiments of the present disclosure, all other embodiments attainable by those ordinary skilled in the art without involving any inventive effort are within the scope of the present disclosure.

Unless otherwise defined, the technical terms or scientific terms used herein shall have the usual meanings understood by those with ordinary skills in the field to which this disclosure belongs. The "first", "second" and similar words used in the present disclosure do not denote any order, quantity or importance, but are only used to distinguish different components. "Including" or "containing" and other similar words mean that an element or article that precedes the word is inclusive of the element or article listed after the word and equivalents thereof, but does not exclude other elements or articles. The terms "connecting" or "connected", and the like, are not limited to physical or mechanical connections, but may include electric connections, whether direct or indirect.

It should be noted that the dimensions and shapes of the various figures in the accompanying drawings are not to scale and are intended to be merely illustrative of the present disclosure. The same or similar reference numerals refer to the same or similar elements or elements having the same or similar functions throughout.

FIG. 1 is a schematic top view of a display panel provided according to an embodiment of the present disclosure. As shown in FIG. 1, the display panel provided according to the embodiment of the present disclosure includes: a base substrate 10 and a plurality of sub-pixels spx located on the base substrate 10, and the plurality of sub-pixels spx are disposed in an array in a first direction F1 and a second direction F2.

Figure 2:
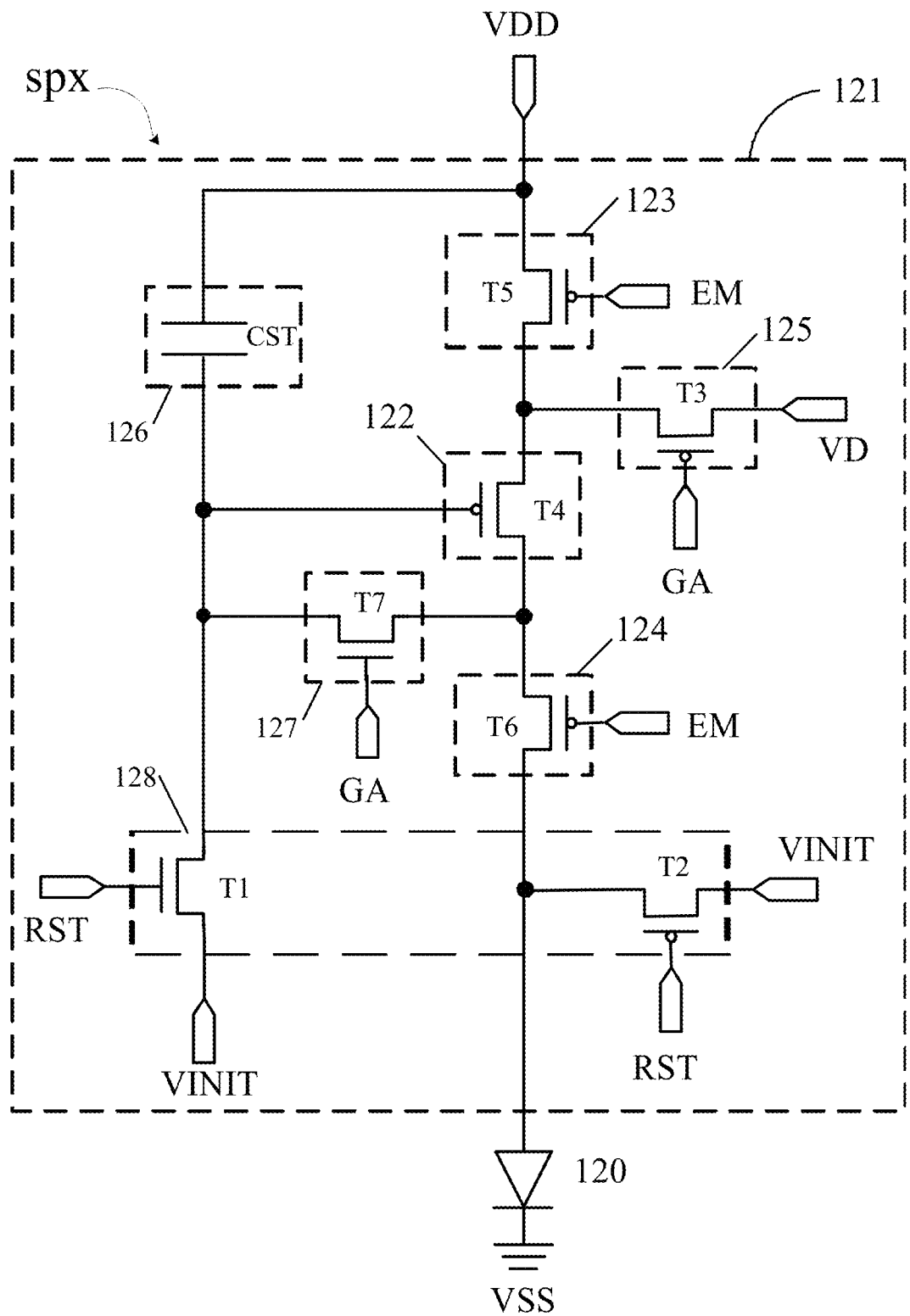
FIG. 2 is a schematic structural diagram of a pixel drive circuit in an embodiment of the present disclosure.

Illustratively, FIG. 2 is a schematic structural diagram of a pixel drive circuit in an embodiment of the present disclosure. As shown in conjunction with FIGS. 1 and 2, at least one sub-pixel spx of the plurality of sub-pixels spx includes: a pixel drive circuit 121 and a light emitting device 120. The pixel drive circuit 121 includes a transistor and a capacitor, and generates an electric signal by interaction of the transistor and the capacitor, and the generated electric signal is input into an anode of the light emitting device 120, and a corresponding voltage is applied to a cathode of the light emitting device 120 to drive the light emitting device 120 to emit light.

As shown in FIG. 2, the pixel drive circuit 121 includes: a drive control circuit 122, a first light emitting control circuit 123, a second light emitting control circuit 124, a data writing circuit 125, a storage circuit 126, a threshold compensation circuit 127 and a reset circuit 128.

The drive control circuit 122 includes a control terminal, a first terminal and a second terminal, and is configured to provide the light emitting device 120 with a drive current to drive the light emitting device 120 to emit light. For example, the first light emitting control circuit 123 is connected to the first terminal of the drive control circuit 122 and a first power terminal VDD, and is configured to realize connective conduction or disconnection between the drive control circuit 122 and the first power terminal VDD.

The second light emitting control circuit 124 is electrically connected to the second terminal of the drive control circuit 122 and the anode of the light emitting device 120, and is configured to realize connective conduction or disconnection between the drive control circuit 122 and the light emitting device 120.

The data writing circuit 125 is electrically connected to the first terminal of the drive control circuit 122. The data writing circuit 125 is configured to write a signal on a data signal line VD to the storage circuit 126.

The storage circuit 126 is electrically connected to the control terminal of the drive control circuit 122 and the first power terminal VDD, and is configured to store a data signal.

The threshold compensation circuit 127 is electrically connected to the control terminal and the second terminal of the drive control circuit 122, and is configured to perform threshold compensation on the drive control circuit 122.

The reset circuit 128 is electrically connected to the control terminal of the drive control circuit 122 and the anode of the light emitting device 120, and is configured to reset the anode of the light emitting device 120 and to reset the control terminal of the drive control circuit 122.

The light emitting device 120 is configured as an electroluminescent diode such as at least one of an OLED and a QLED. The light emitting device 120 includes the anode, a light emitting functional layer and the cathode which are laminated. Further, the light emitting functional layer further includes film layers such as a hole injection layer, a hole transport layer, a light emitting layer, an electron transport layer, and an electron injection layer. Of course, in a practical application, the light emitting device 120 is designed and determined according to requirements of a practical application environment, which is not limited thereto.

Illustratively, as shown in FIG. 2, the drive control circuit 122 includes: a drive transistor T4. The control terminal of the drive control circuit 122 includes a drive gate of the drive transistor T4. The first terminal of the drive control circuit 122 includes a first electrode of the drive transistor T4. The second terminal of the drive control circuit 122 includes a second electrode of the drive transistor T4.

Illustratively, as shown in FIG. 2, the data writing circuit 125 includes a data writing transistor T3. The storage circuit 126 includes a storage capacitor CST. The threshold compensation circuit 127 includes a threshold compensation transistor T7. The first light emitting control circuit 123 includes a first light emitting control transistor T5. The second light emitting control circuit 124 includes a second light emitting control transistor T6. The reset circuit 128 includes an initialization transistor T1 and a reset transistor T2.

Specifically, a first electrode of the data writing transistor T3 is electrically connected to the first electrode of the drive transistor T4, a second electrode of the data writing transistor T3 is configured to be electrically connected to the data signal line VD to receive a data signal, and a gate of the data writing transistor T3 is configured to be electrically connected to a scan line GA to receive a signal.

A first electrode of the storage capacitor CST is electrically connected to the first power terminal VDD, and a second electrode of the storage capacitor CST is electrically connected to the drive gate of the drive transistor T4.

A first electrode of the threshold compensation transistor T7 is electrically connected to the second electrode of the drive transistor T4, a second electrode of the threshold compensation transistor T7 is electrically connected to the drive gate of the drive transistor T4, and a gate of the threshold compensation transistor T7 is configured to be electrically connected to a scan line GA to receive a signal.

A first electrode of the initialization transistor T1 is configured to be electrically connected to an initialization signal line VINIT to receive a reset signal, a second electrode of the initialization transistor T1 is electrically connected to the drive gate of the drive transistor T4, and a gate of the initialization transistor T1 is configured to be electrically connected to a reset line RST to receive a signal.

A first electrode of the reset transistor T2 is configured to be electrically connected to an initialization line VINIT to receive the reset signal, a second electrode of the reset transistor T2 is electrically connected to the anode of the light emitting device 120, and a gate of the reset transistor T2 is configured to be electrically connected to a reset line RST to receive a signal.

A first electrode of the first light emitting control transistor T5 is electrically connected to the first power terminal VDD, a second electrode of the first light emitting control transistor T5 is electrically connected to the first electrode of the drive transistor T4, and a gate of the first light emitting control transistor T5 is configured to be electrically connected to a light emitting control line EM to receive a light emitting control signal.

A first electrode of the second light emitting control transistor T6 is electrically connected to the second electrode of the drive transistor T4, a second electrode of the second light emitting control transistor T6 is electrically connected to the anode of the light emitting device 120, and a gate of the second light emitting control transistor T6 is configured to be electrically connected to a light emitting control line EM to receive a light emitting control signal.

The cathode of the light emitting device 120 is electrically connected to a second power terminal VSS. The first electrode and the second electrode of each transistor may be determined as source electrodes or drain electrodes according to an actual application, which is not limited thereto.

Illustratively, one of the first power terminal VDD and the second power terminal VSS is a high voltage terminal, and the other is a low voltage terminal. For example, according to the embodiment shown in FIG. 2, the first power terminal VDD is a voltage source to output a constant first voltage, and the first voltage is a positive voltage; and the second power terminal VSS is a voltage source to output a constant second voltage, and the second voltage is a negative voltage. For example, in some examples, the second power terminal VSS may be grounded.

Figure 3:
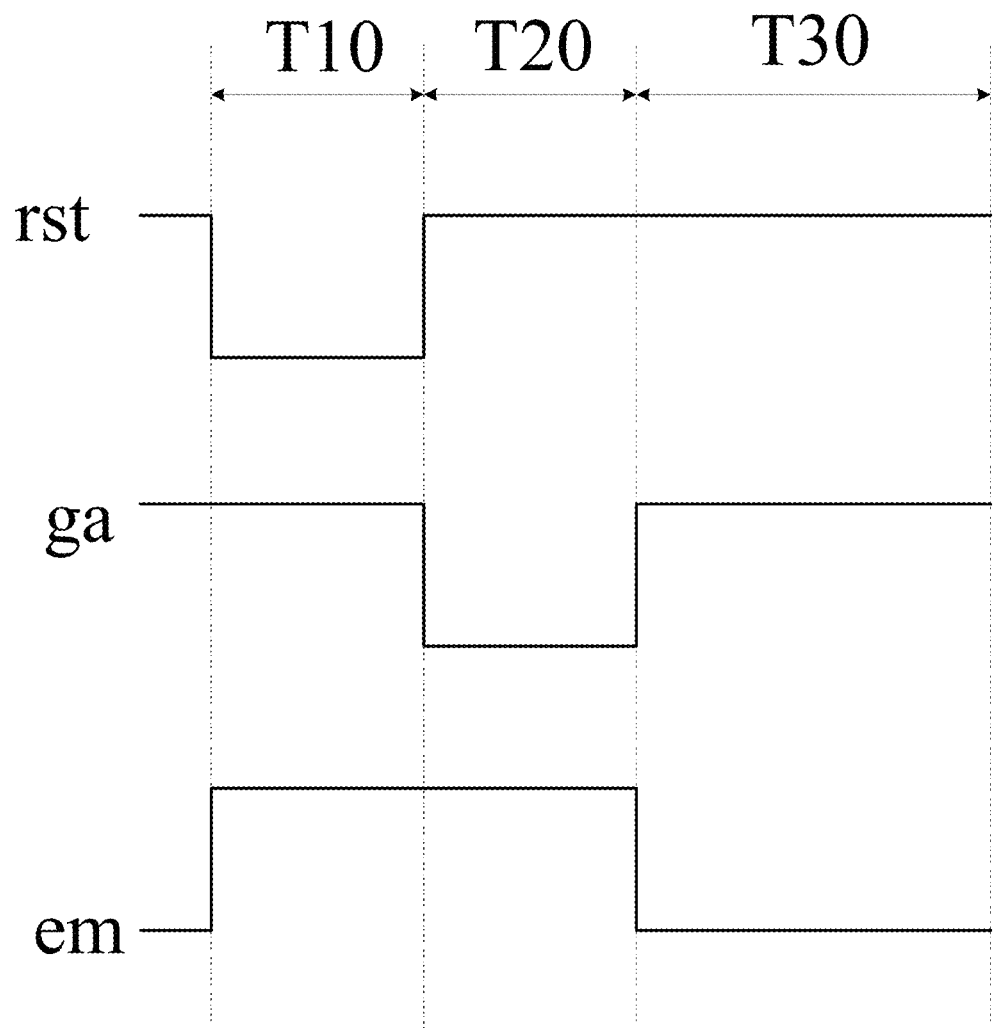
FIG. 3 is a signal timing diagram corresponding to the pixel drive circuit shown in FIG. 2.

FIG. 3 is a signal timing diagram corresponding to the pixel drive circuit shown in FIG. 2. As shown in FIG. 3, in a frame of display time, a working process of the pixel drive circuit includes three stages: T10, T20, and T30, where rst represents a signal transmitted on the reset lines RST, ga represents a signal transmitted on the scan lines GA, and em represents a signal transmitted on the light emitting control lines EM.

In the stage T10, the signal rst controls the initialization transistor T1 to be conducted so that the signal transmitted on the initialization line VINIT can be supplied to the drive gate of the drive transistor T4 so as to reset the drive gate of the drive transistor T4. The signal rst controls the reset transistor T2 to be conducted to supply the signal transmitted on the initialization line VINIT to the anode of the light emitting device 120 so as to reset the anode of the light emitting device 120. Moreover, in this stage, the signal ga controls both the data writing transistor T3 and the threshold compensation transistor T7 to be turned off, and the signal em controls both the first light emitting control transistor T5 and the second light emitting control transistor T6 to be turned off.

In the stage T20, the signal ga controls the data writing transistor T3 and the threshold compensation transistor T7 to be conducted, and the conducted data writing transistor T3 enables the data signal transmitted on the data signal line VD to charge the drive gate of the drive transistor T4, so that a voltage of the drive gate of the drive transistor T4 changes to Vdata+|Vth|, where Vth represents a threshold voltage of the drive transistor T4, and Vdata represents a voltage of the data signal. Moreover, in this stage, the signal rst controls both the initialization transistor T1 and the reset transistor T2 to be turned off, and the signal em controls both the first light emitting control transistor T5 and the second light emitting control transistor T6 to be turned off.

In the stage T30, the signal em controls both the first light emitting control transistor T5 and the second light emitting control transistor T6 to be conducted. The conducted first light emitting control transistor T5 supplies a voltage Vdd of the first power terminal VDD to the first electrode of the drive transistor T4, so that a voltage of the first electrode of the drive transistor T4 may be Vdd. The drive transistor T4 generates the drive current according to the voltage Vdata+ |Vth| of the drive gate and the voltage Vdd of the first electrode. The drive current is supplied to the light emitting device 120 through the conducted second light emitting control transistor T6, and drives the light emitting device 120 to emit light. Moreover, in this stage, the signal rst controls the initialization transistor T1 and the reset transistor T2 to be turned off, and the signal ga controls the data writing transistor T3 and the threshold compensation transistor T7 to be turned off.

It should be noted that in the embodiments of the present disclosure, the sub-pixel may also include a pixel drive circuit of other structure, namely a structure including other numbers of transistors in addition to the pixel drive circuit shown in FIG. 2, which is not limited by the embodiments of the present disclosure.

In the display panel provided according to the embodiment of the present disclosure, as shown in FIG. 1, the display panel includes: the base substrate 10 and the plurality of sub-pixels spx located on the base substrate 10, FIG. 1 is illustrated in an arrangement mode of a limited number of sub-pixels spx, and the number and arrangement mode of the sub-pixels spx are not limited.

Figure 4:
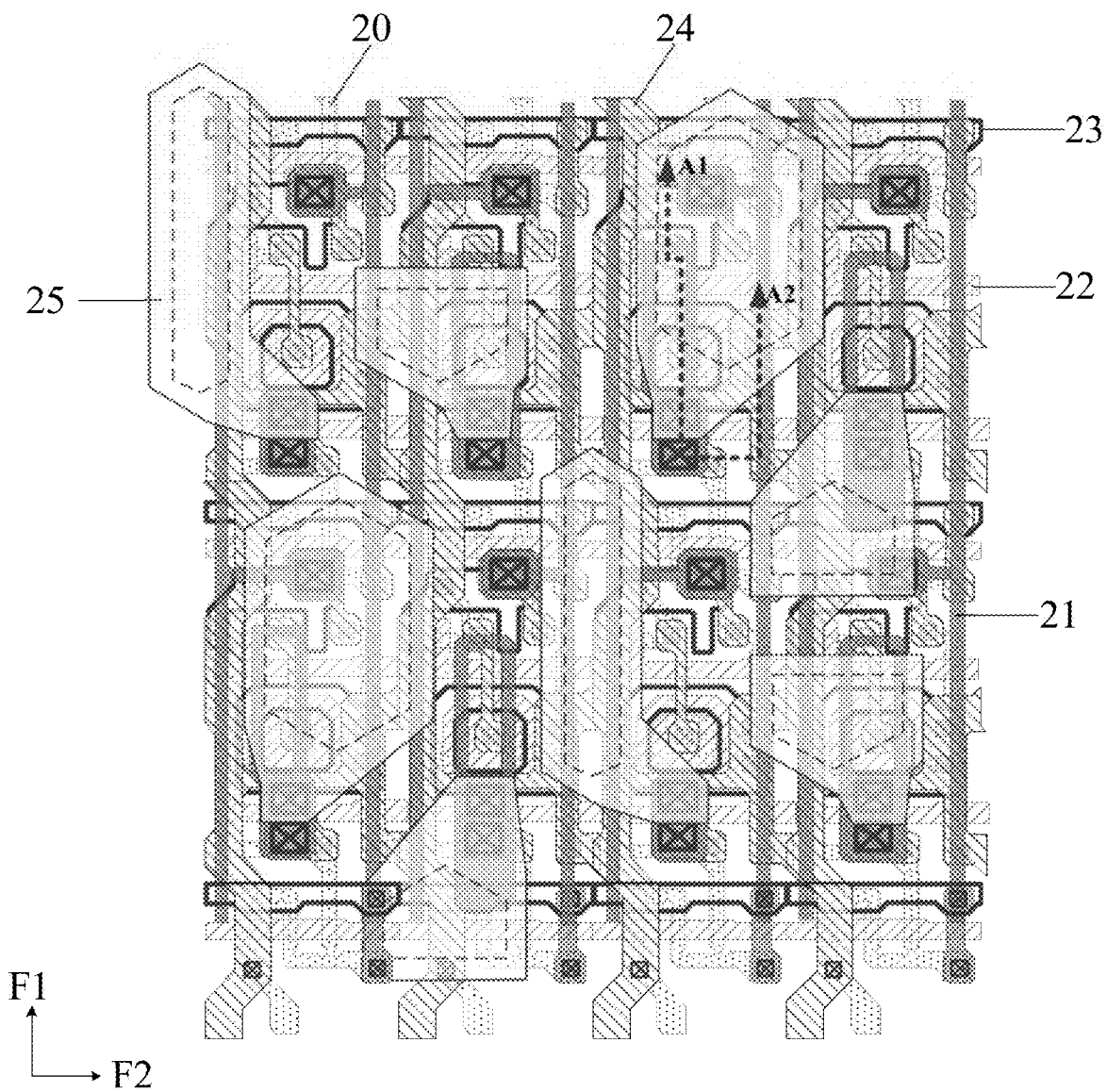
FIG. 4 is a schematic layout structure diagram of a plurality of sub-pixels in a display panel provided according to an embodiment of the present disclosure.
Figure 5:
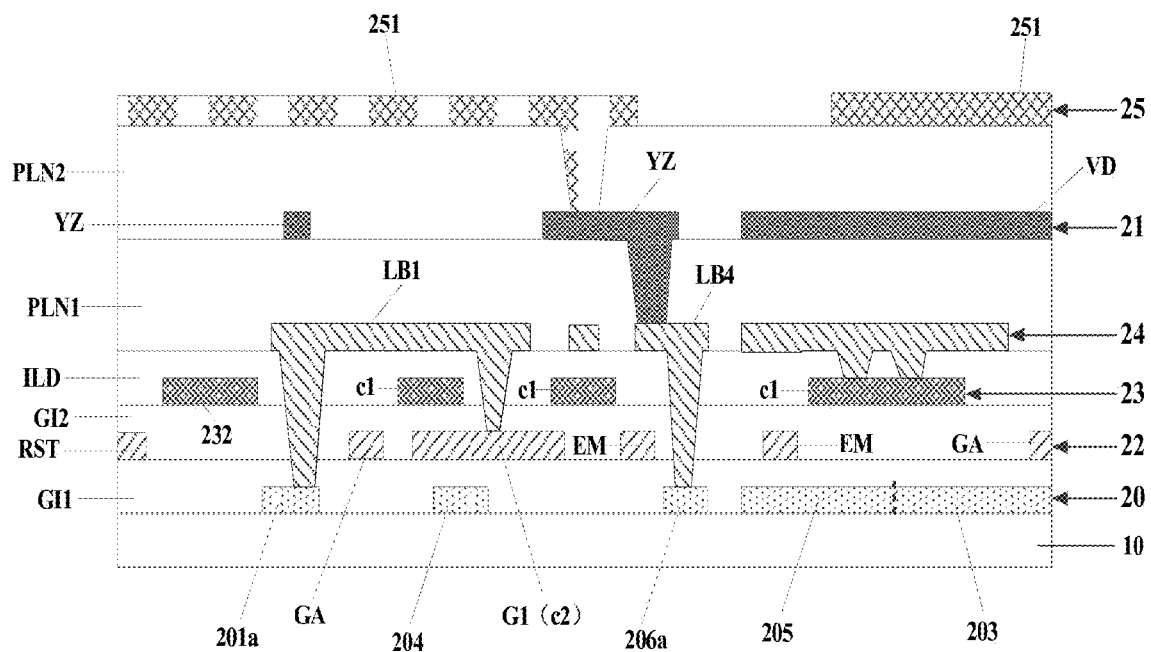
FIG. 5 is a schematic cross-sectional diagram at a dotted line A1-A2 in FIG. 4.
Figure 6:
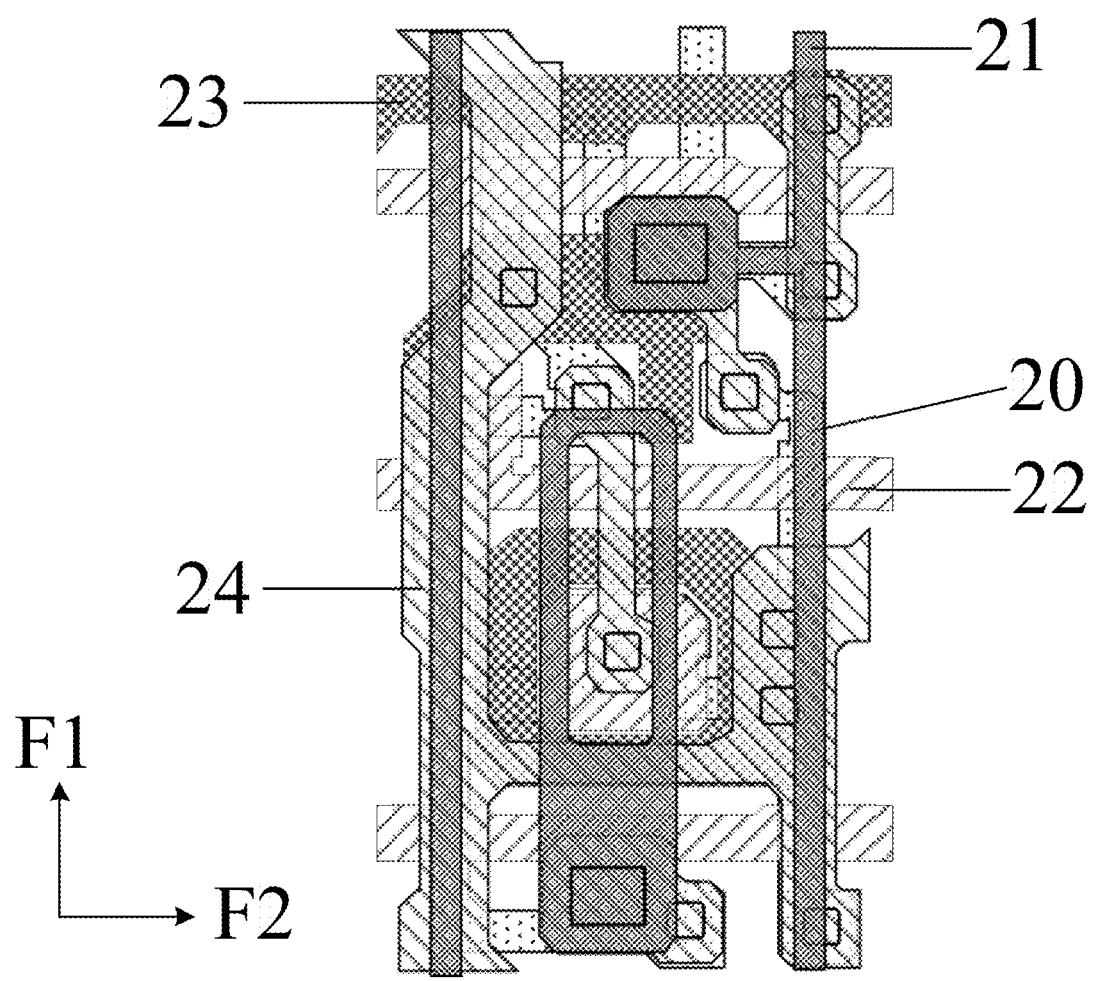
FIG. 6 is a schematic layout structure diagram of a sub-pixel in a display panel provided according to an embodiment of the present disclosure.
Figure 7:
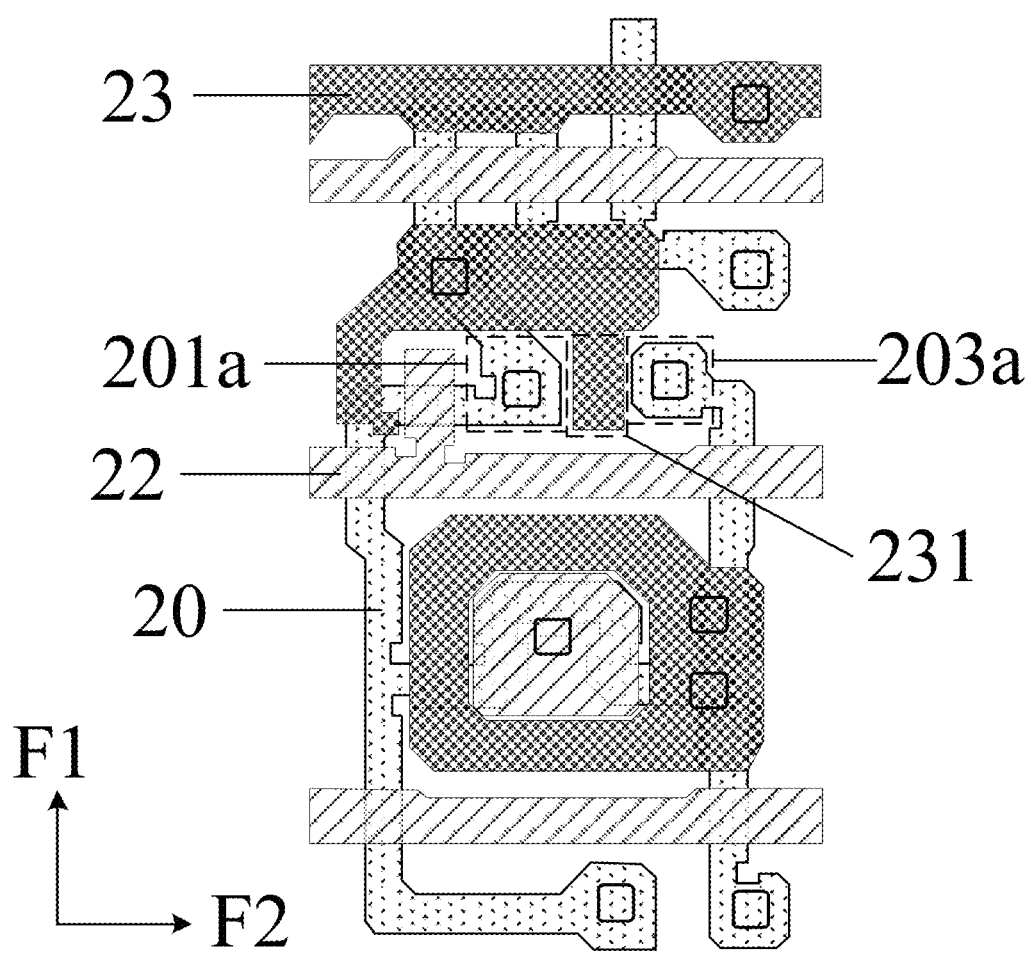
FIGS. 7 to 9 are schematic top views of a plurality of film layers in a display panel provided according to an embodiment of the present disclosure.
Figure 8:
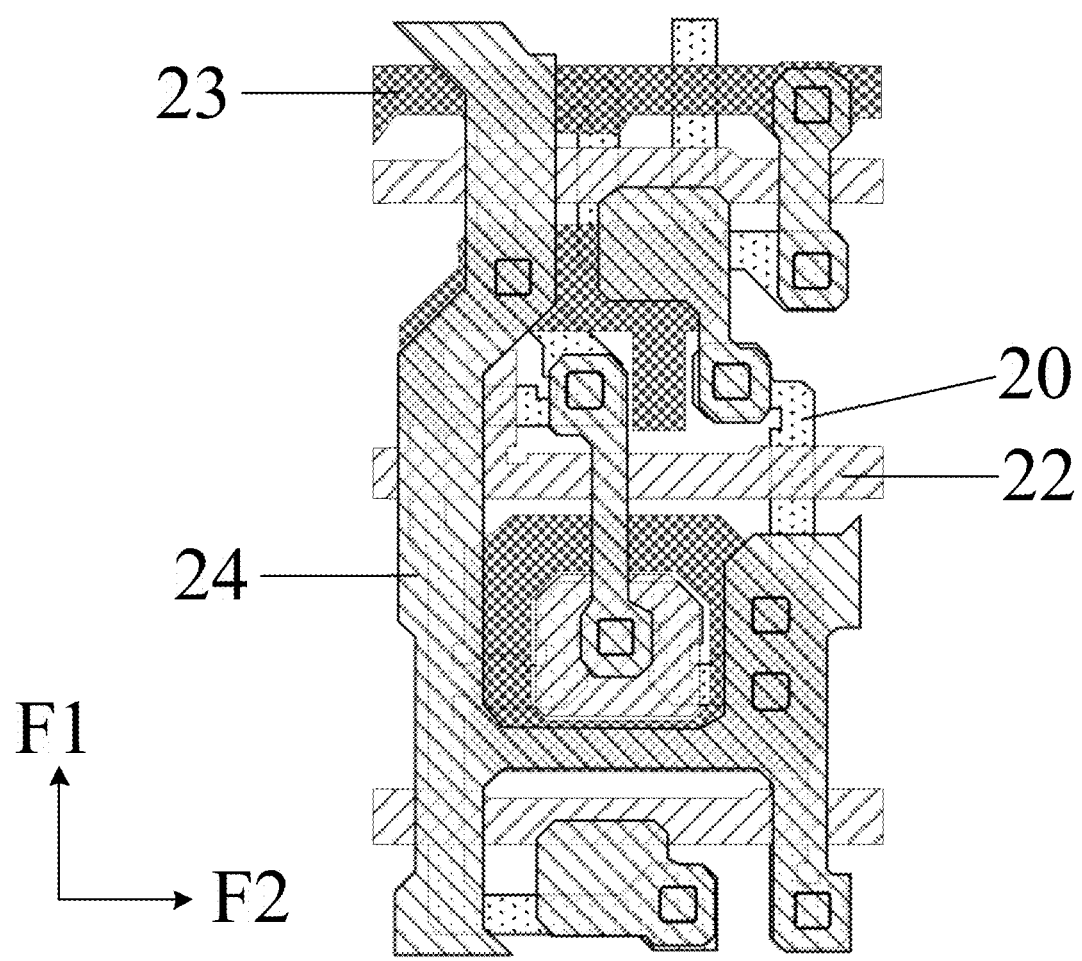
Figure 9:
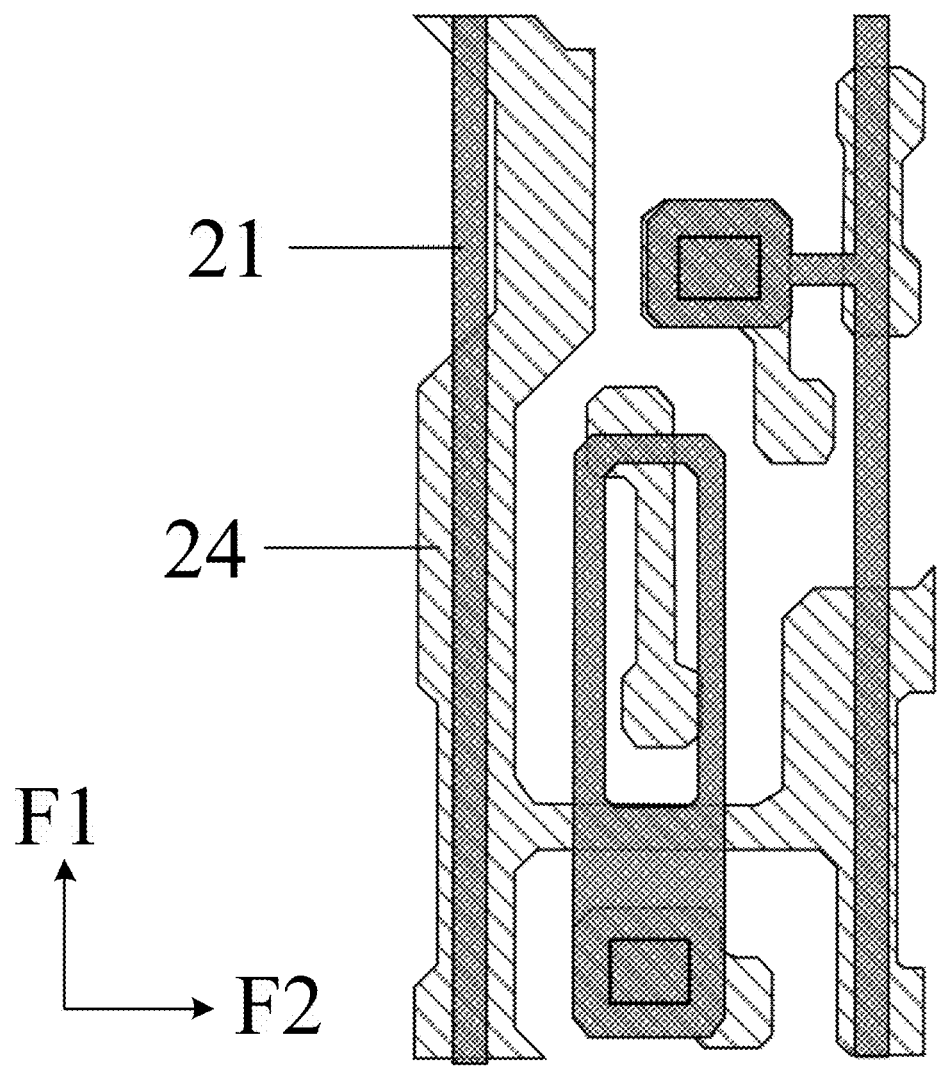

FIG. 4 is a schematic layout structure diagram of a plurality of sub-pixels in a display panel provided according to an embodiment of the present disclosure, FIG. 5 is a schematic cross-sectional diagram at a dotted line A1-A2 in FIG. 4, and FIG. 6 is a schematic layout structure diagram of a sub-pixel in a display panel provided according to an embodiment of the present disclosure. In order to more clearly illustrate the structure of each film layer, FIGS. 7 to 9 are schematic top views of part of film layers in FIG. 6. As shown in FIGS. 4 to 9, in the embodiment of the present disclosure, the sub-pixel includes: a semiconductor layer 20, a first conductive layer 21 and a second conductive layer 22.

Figure 10:
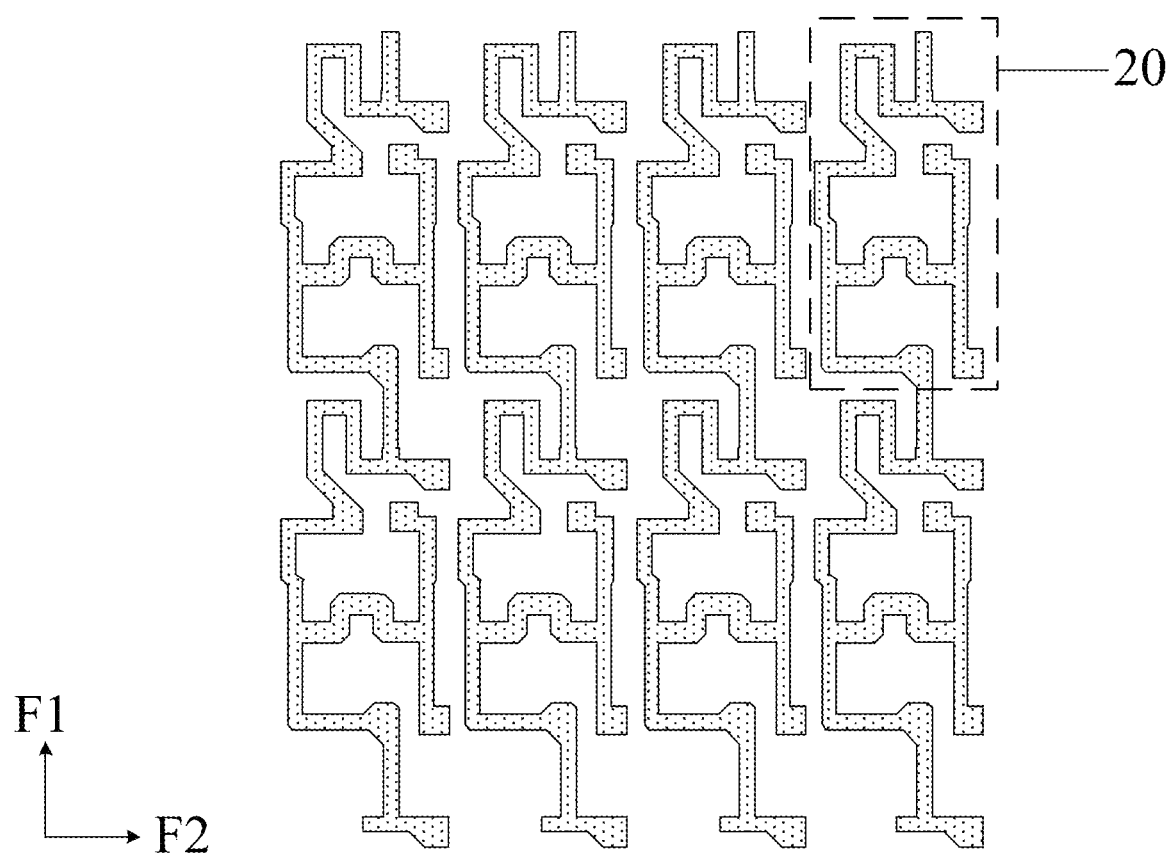
FIG. 10 is a schematic top view of a semiconductor layer corresponding to a plurality of sub-pixels.
Figure 11:
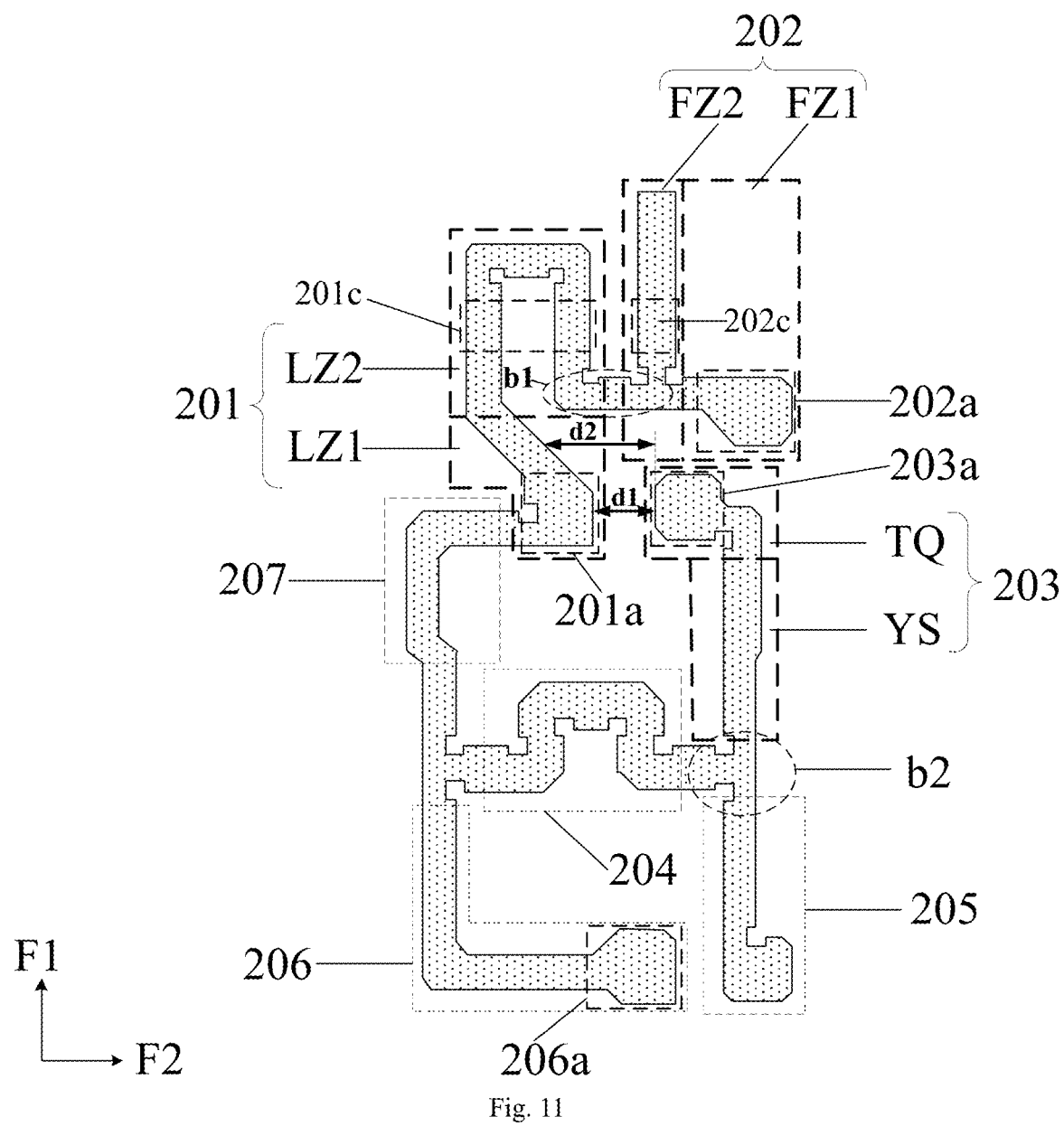
FIG. 11 is an enlarged schematic diagram of a semiconductor layer corresponding to one sub-pixel in FIG. 10.

The semiconductor layer 20 is located on the base substrate. FIG. 10 is a schematic top view of a semiconductor layer 20 corresponding to a plurality of sub-pixels. FIG. 11 is an enlarged schematic diagram of a semiconductor layer 20 corresponding to one sub-pixel in FIG. 10. As shown in conjunction with FIGS. 10 and 11, the semiconductor layer 20 includes: a first active layer 201 of the initialization transistor, a second active layer 202 of the reset transistor, and a third active layer 203 of the data writing transistor.

Specifically, the semiconductor layer 20 may be patterned using a semiconductor material, each active layer in the semiconductor layer 20 includes a first conductive region, a second conductive region and a channel region, where the channel region is located between the first conductive region and the second conductive region, and the first conductive region and the second conductive region may be obtained conductively on the semiconductor layer 20. For example, the first conductive region and the second conductive region may be obtained conductively on the semiconductor layer 20 by doping n-type impurities and p-type impurities into the semiconductor layer 20. Optionally, the first conductive region serves as a source electrode of a transistor, and the second conductive region serves as a drain electrode of the transistor; or, the first conductive region serves as the drain electrode of the transistor, and the second conductive region serves as the source electrode of the transistor, which is not limited thereto.

Figure 12:
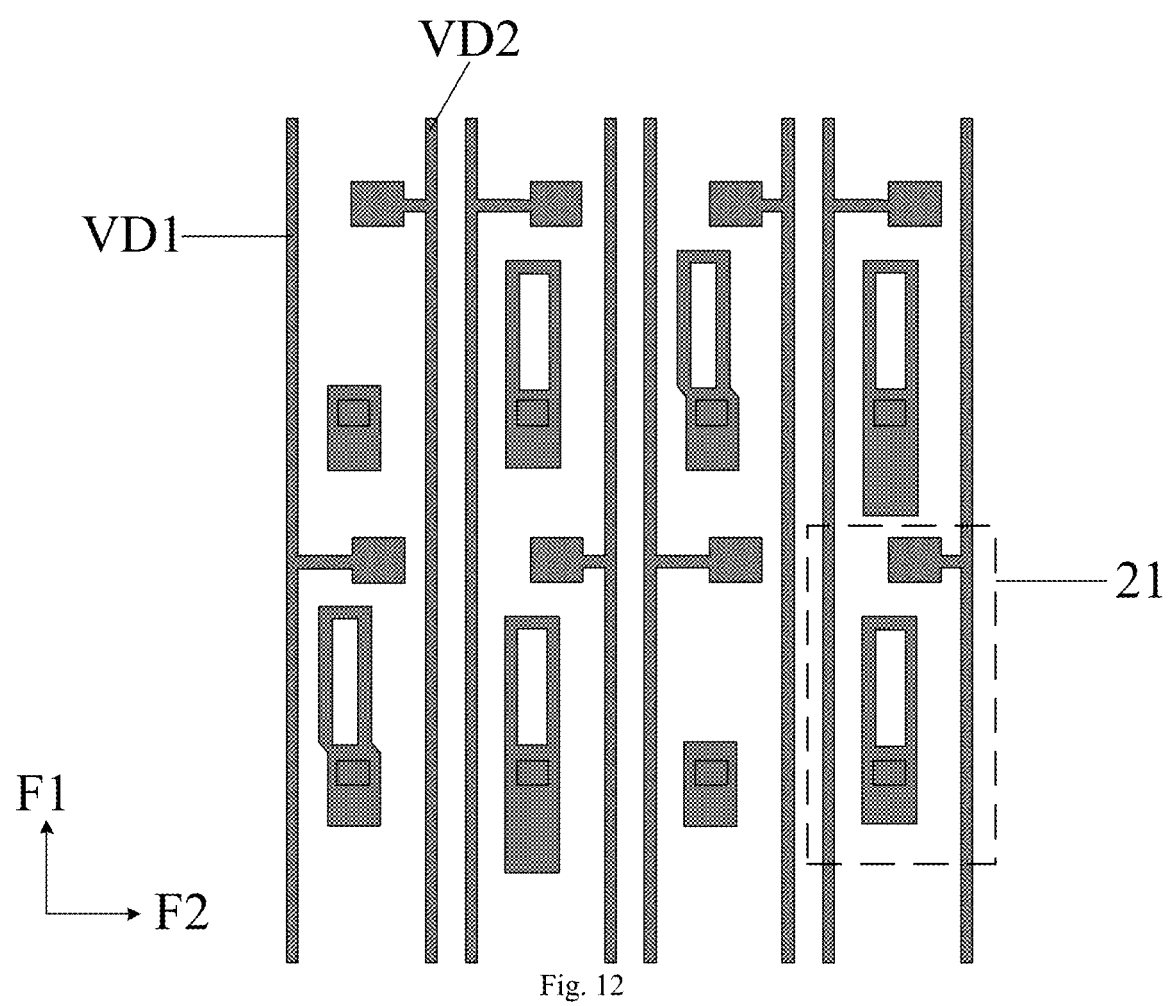
FIG. 12 is a schematic top view of a first conductive layer corresponding to a plurality of sub-pixels.
Figure 13:
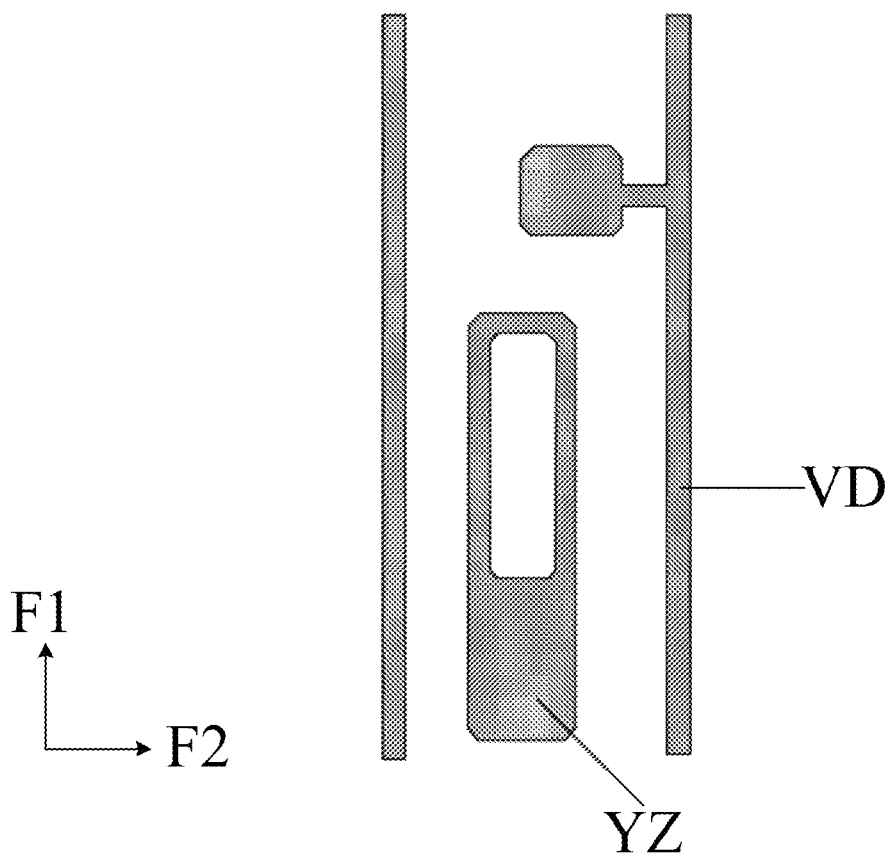
FIG. 13 is an enlarged schematic diagram of a first conductive layer corresponding to one sub-pixel in FIG. 12.

A first conductive layer 21 is located on a side, facing away from the base substrate, of the semiconductor layer 20. FIG. 12 is a schematic top view of a first conductive layer 21 corresponding to a plurality of sub-pixels. FIG. 13 is an enlarged schematic diagram of a first conductive layer 21 corresponding to one sub-pixel in FIG. 12. As shown in conjunction with FIGS. 12 and 13, the first conductive layer 21 includes: a data signal line VD extending in a first direction F.

Figure 14:
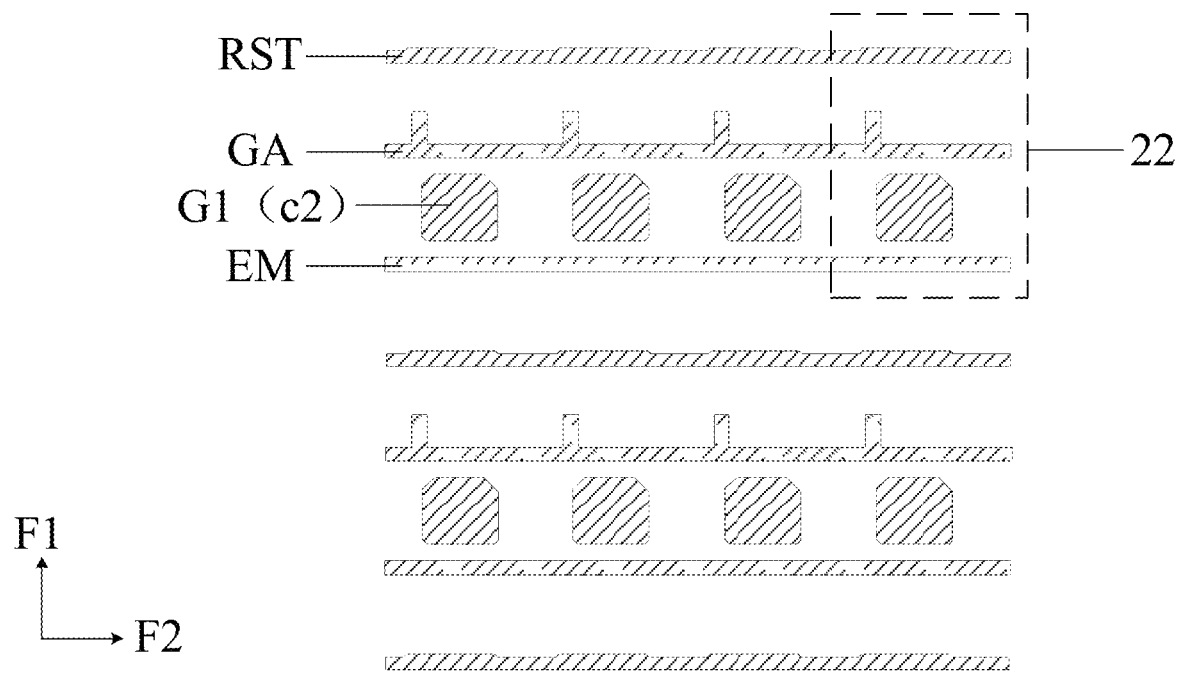
FIG. 14 is a schematic top view of a second conductive layer corresponding to a plurality of sub-pixels.
Figure 15:
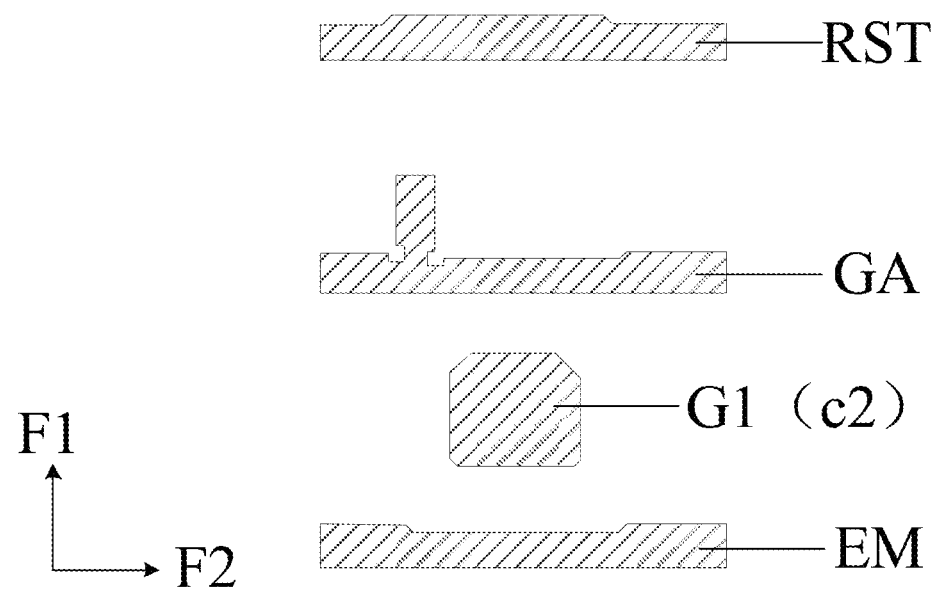
FIG. 15 is an enlarged schematic diagram of a second conductive layer corresponding to one sub-pixel in FIG. 14.

A second conductive layer 22 is located on the base substrate. FIG. 14 is a schematic top view of a second conductive layer 22 corresponding to a plurality of sub-pixels. FIG. 15 is an enlarged schematic diagram of a second conductive layer corresponding to one sub-pixel in FIG. 14. As shown in conjunction with FIGS. 14 and 15, the second conductive layer 22 includes: the drive gate G1 of the drive transistor.

The drive gate G1 is electrically connected to a first conductive region 201a of the first active layer 201.

The data signal line VD is electrically connected to a first conductive region 203a of the third active layer 203.

An orthographic projection of the second active layer 202 on the base substrate is located between an orthographic projection of the first active layer 201 on the base substrate and an orthographic projection of the data signal line VD on the base substrate.

In a practical application, since the refresh frequency of the display panel is high, an electric potential in the data signal line jumps during light emission, and disturbance caused by electric field coupling may occur to cause the electric potential of the drive gate of the drive transistor to change, thereby affecting the display effect. In the embodiments of the present disclosure, the first active layer 201 is disposed on a side, facing away from the data signal line VD, of the second active layer 202, so that the distance between the first active layer 201 connected with the drive gate G1 and the third active layer 203 connected with the data signal line VD is increased, the influence of the data signal line VD on the drive gate G1 of the drive transistor is relieved, and the display effect of the display panel is improved.

Specifically, in the above-described display panel provided according to the embodiments of the present disclosure, in conjunction with FIGS. 6, 11 and 13, an orthographic projection of a channel region 202c of the second active layer 202 on the base substrate is located between an orthographic projection of a channel region 201c of the first active layer 201 on the base substrate and an orthographic projection of the data signal line VD on the base substrate, so that it is ensured that the distance between the first active layer 201 connected with the drive gate G1 and the third active layer 203 connected with the data signal line VD is long, the influence of the data signal line VD on the drive gate G1 of the drive transistor is further relieved, and a good display effect of the display panel is ensured.

Furthermore, as shown in FIGS. 7 to 9, the display panel provided according to the embodiments of the present disclosure may further include: a third conductive layer 23 located on the base substrate.

Figure 16:
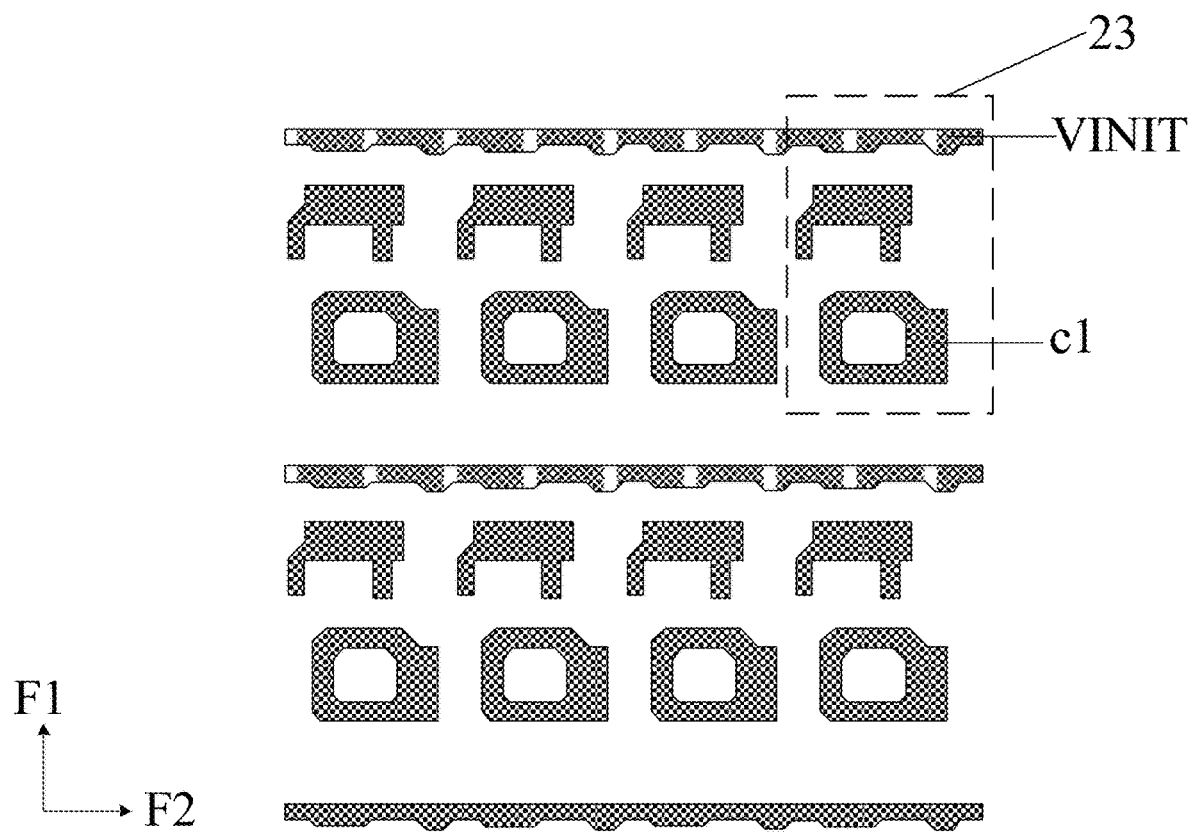
FIG. 16 is a schematic top view of a third conductive layer corresponding to a plurality of sub-pixels.
Figure 17:
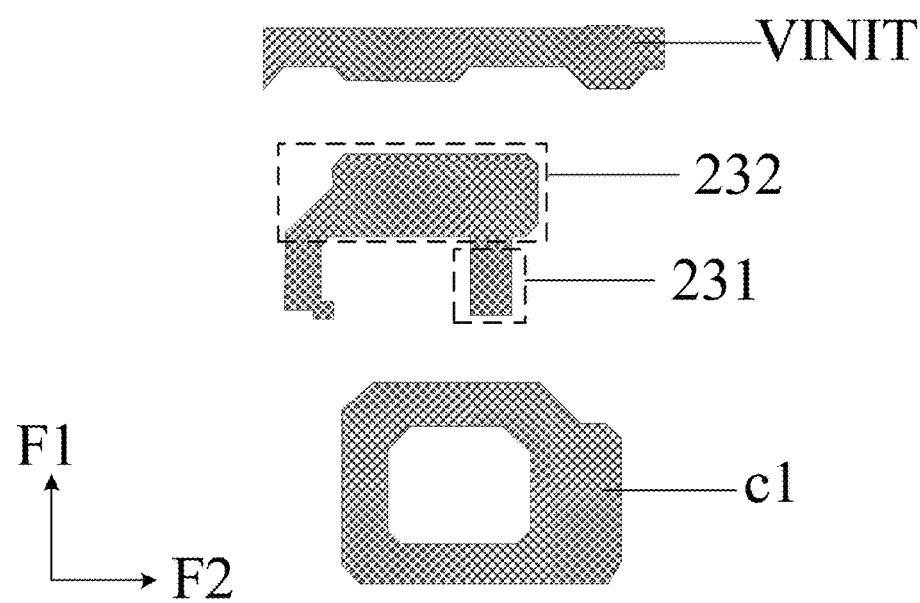
FIG. 17 is an enlarged schematic diagram of a third conductive layer corresponding to one sub-pixel in FIG. 16.

FIG. 16 is a schematic top view of a third conductive layer 23 corresponding to a plurality of sub-pixels. FIG. 17 is an enlarged schematic diagram of a third conductive layer 23 corresponding to one sub-pixel in FIG. 16. As shown in conjunction with FIGS. 16 and 17, the third conductive layer 23 includes: the initialization signal line VINIT extending in a second direction F2, and the second direction F2 is intersected with the first direction F1.

The initialization signal line VINIT is electrically connected with a first conductive region 202a of the second active layer 202.

The first conductive region 202a of the second active layer 202 is located at one end, facing away from the first active layer 201, of the second active layer 202.

By arranging the first conductive region 202a connected to the initialization signal line VINIT at one end, facing away from the first active layer 201, of the second active layer 202, more space can be left for the first active layer 201, so that the pattern of the first active layer 201 is far away from the first conductive region 203a of the third active layer 203, it is avoided that the signal of the data signal line VD passes through the third active layer 203 and the second active layer 202 to affect the electric potential of the drive gate of the drive transistor, and it is ensured that the display panel has a good display effect.

Furthermore, in the display panel provided according to the embodiments of the present disclosure, referring to FIG. 7, the display panel further includes: a shielding structure 231 located on the base substrate.

An orthographic projection of the shielding structure 231 on the base substrate is located between an orthographic projection of the first conductive region 201a of the first active layer 201 on the base substrate and an orthographic projection of the first conductive region 203a of the third active layer 203 on the base substrate.

By arranging the shielding structure 231 between the first conductive region 201a of the first active layer 201 and the first conductive region 203a of the third active layer 203, the signal interference between the third active layer 203 and the first active layer 201 can be shielded, and the signal of the data signal line VD is further prevented from generating interference. The electric potential of the drive gate G1 of the drive transistor is affected by the third active layer 203 and the first active layer 201, and it is ensured that the display panel has a good display effect.

In a specific implementation, the display panel provided according to the embodiment of the present disclosure further includes: a fourth conductive layer 24 located on one side, facing away from the base substrate, of the semiconductor layer 20.

Figure 18:
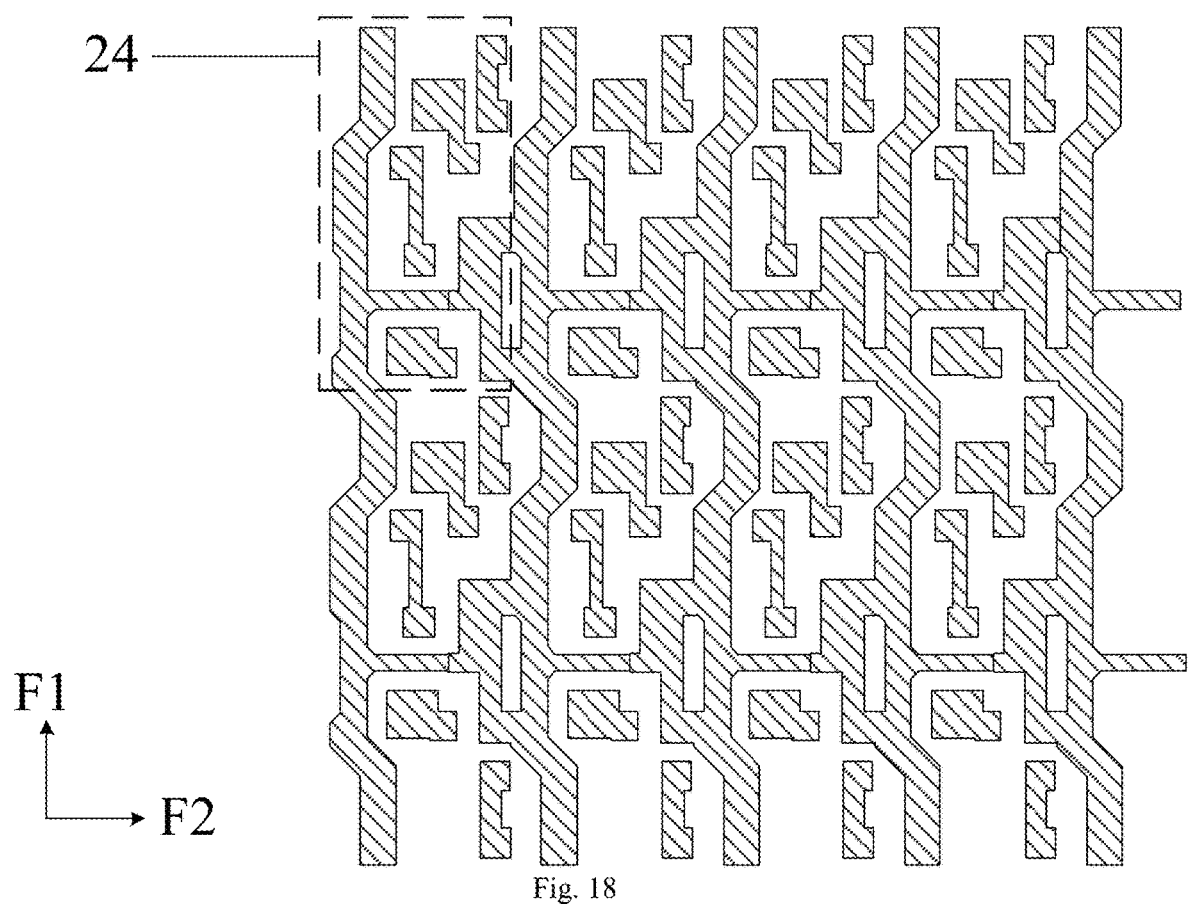
FIG. 18 is a schematic top view of a fourth conductive layer corresponding to a plurality of sub-pixels.
Figure 19:
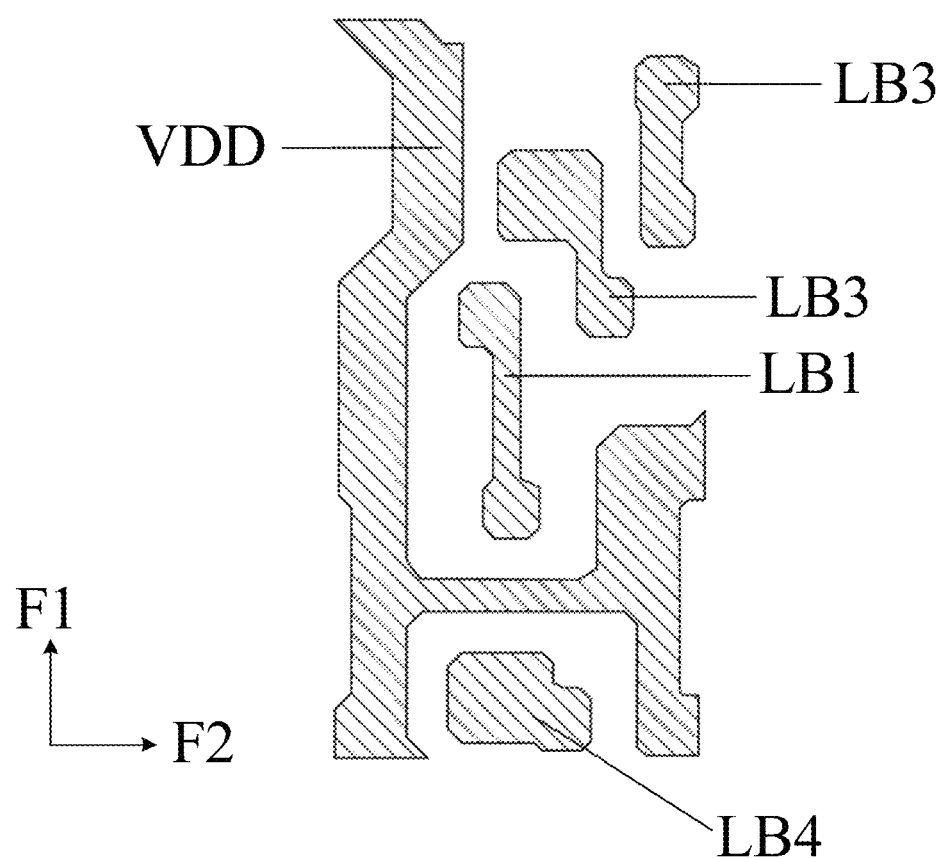
FIG. 19 is an enlarged schematic diagram of a fourth conductive layer corresponding to one sub-pixel in FIG. 18.

FIG. 18 is a schematic top view of a fourth conductive layer 24 corresponding to a plurality of sub-pixels. FIG. 19 is an enlarged schematic diagram of a fourth conductive layer 24 corresponding to one sub-pixel in FIG. 18. As shown in conjunction with FIGS. 18 and 19, the fourth conductive layer 24 includes: a fixed potential signal line VDD extending in the first direction F1; and the shielding structure 231 is electrically connected to the fixed potential signal line VDD.

During light emitting process, the fixed potential signal line VDD has a stable power supply signal therein. For example, a power supply signal with high-level may be applied to the fixed potential signal line VDD, or a power supply signal with low-level may also be applied to the fixed potential signal line VDD, where the magnitude of the power supply signal applied to the fixed potential signal line VDD is not limited. The shielding structure 231 is configured to be electrically connected to the fixed potential signal line VDD, so that a stable power supply signal is provided in the shielding structure 231 in the light emitting process, a better shielding effect is achieved, the signal interference between the third active layer 203 and the first active layer 201 is further reduced, and accordingly the signal jitter of the data signal line VD is prevented from affecting the drive gate G1 of the drive transistor.

In a specific implementation, in the above-described display panel provided according to the embodiments of the present disclosure, referring to FIGS. 16 and 17, the shielding structure 231 is disposed in the same layer as the initialization signal line VINIT. Thus, in the process, the shielding structure 231 and the initialization signal line VINIT may be manufactured by adopting the same composition process, specifically, patterns of the shielding structure 231 and the initialization signal line VINIT may be obtained simultaneously when the third conductive layer 23 is patterned, so that a one-step manufacturing process is reduced, and the manufacturing cost is saved.

Specifically, in the above-described display panel provided according to the embodiment of the present disclosure, referring to FIG. 17, the third conductive layer 23 further includes: a conductive connection structure 232 connected to the shielding structure 231.

The fixed potential signal line VDD is electrically connected to the shielding structure 231 through the conductive connection structure 232.

Referring to FIG. 8 at the same time, an orthographic projection of the fixed potential signal line VDD on the base substrate has a certain distance from the orthographic projection of the shielding structure 231 on the base substrate. By arranging the conductive connection structure 232 in the third conductive layer 23, the electric connection between the fixed potential signal line VDD and the shielding structure 231 can be realized. Specifically, an insulating layer is formed between the third conductive layer 23 and the fourth conductive layer 24, the conductive connection structure 232 is connected with the fixed potential signal line VDD through a through hole in the insulating layer, the conductive connection structure 232 is connected to the shielding structure 231 in the same layer, in the manufacturing process, the conductive connection structure 232 and the shielding structure 231 are manufactured into the same graph, and accordingly a connection structure does not need to be independently disposed, and the manufacturing process is simple.

In a specific implementation, as shown in FIG. 5, the first conductive layer 21 is disposed on a side, facing away from the base substrate 10, of the semiconductor layer 20, the second conductive layer 22 is disposed between the first conductive layer 21 and the semiconductor layer 20, the third conductive layer 23 is disposed between the first conductive layer 21 and the second conductive layer 22, and the fourth conductive layer 24 is disposed between the first conductive layer 21 and the third conductive layer 23. In addition, a fifth conductive layer 25 is disposed on a side, facing away from the base substrate 10, of the first conductive layer 21. The fifth conductive layer 25 includes a plurality of anodes 251. In order to avoid shorting of conductive parts between adjacent conductive layers, a first gate insulating layer GI1 is disposed between the semiconductor layer 20 and the second conductive layer 22, a second gate insulating layer GI2 is disposed between the second conductive layer 22 and the third conductive layer 23, an interlayer insulating layer ILD is disposed between the third conductive layer 23 and the fourth conductive layer 24, a first flat layer PLN1 is disposed between the first conductive layer 21 and the fourth conductive layer 24, and a second flat layer PLN2 is disposed between the first conductive layer 21 and the fifth conductive layer 25.

In a practical application, in the above-described display panel provided according to the embodiments of the present disclosure, referring to FIG. 19, the fourth conductive layer 24 further includes: a first conductive connection part LB1, a second conductive connection part LB2 and a third conductive connection part LB3 which are insulated from one another.

Referring to FIG. 5 at the same time, the drive gate G1 is electrically connected to the first conductive region 201a of the first active layer 201 through the first conductive connection part LB1. Specifically, one end (i.e., the upper end in FIG. 19) of the first conductive connection part LB1 is connected to the first conductive region 201a of the first active layer 201 through at least one via hole penetrating through the interlayer insulating layer ILD, the second gate insulating layer GI2, and the first gate insulating layer GI1, and the other end (i.e., the lower end in FIG. 19) is connected to the drive gate G1 through at least one via hole penetrating through the interlayer insulating layer ILD and the second gate insulating layer GI2.

The data signal line VD is electrically connected to the first conductive region 203a of the third active layer 203 through the second conductive connection part LB2. Specifically, one end (i.e., the upper end in FIG. 19) of the second conductive connection part LB2 is connected with the first conductive region 203a of the third active layer 203 through at least one via hole penetrating through the interlayer insulating layer ILD, the second gate insulating layer GI2 and the first gate insulating layer GI1, and the other end (i.e., the lower end in FIG. 19) is connected to the data signal line VD through at least one via hole through the first flat layer PLN1.

The initialization signal line VINIT is electrically connected to the first conductive region 202a of the second active layer 202 through the third conductive connection part LB3. Specifically, one end (i.e., the upper end in FIG. 19) of the third conductive connection part LB3 is connected to the initialization signal line VINIT through at least one via hole penetrating through the interlayer insulating layer ILD, and the other end (i.e., the lower end in FIG. 19) is connected to the first conductive region 202a of the second active layer 202 through at least one via hole penetrating through the interlayer insulating layer ILD, the second gate insulating layer GI2 and the first gate insulating layer GI1.

In addition, the fourth conductive layer 24 further includes: a fourth conductive connection part LB4. One end (i.e., the right end in FIG. 19) of the fourth conductive connection part LB4 is connected to a first conductive region 206a of a sixth active layer 206 of the second light emitting control transistor through at least one via hole penetrating through the interlayer insulating layer ILD, the second gate insulating layer GI2 and the first gate insulating layer GI1, the other end (i.e., the left end in FIG. 19) of the fourth conductive connection part LB4 is connected to an anode switching part YZ located in the first conductive layer 21 through at least one via hole penetrating through the first flat layer PLN1, and the anode switching part YZ is connected to the anode 251 through at least one via hole penetrating through the second flat layer PLN2, so that electric connection between the second light emitting control transistor and the anode of the light emitting device 120 is achieved.

Specifically, in the above-described display panel provided according to the embodiments of the present disclosure, as shown in FIG. 11, the first active layer 201 includes: a first bending part LZ1 and a second bending part LZ2.

One end of the first bending part LZ1 is the first conductive region 201a of the first active layer 201, and the other end of the first bending part LZ1 is connected to the second bending part LZ2 and is bent towards one side facing away from the data signal line VD.

The second bending part LZ2 is n-shaped, one end of the second bending part LZ2 is connected to the first bending part LZ1, and the other end of the second bending part LZ2 is connected to the second active layer 202.

Referring to FIGS. 14 and 15 at the same time, the second conductive layer 22 further includes: the reset line RST. The gate of the initialization transistor is the part where the reset line RST overlaps the first active layer 201. It can be seen from the combination of FIG. 7 that the first active layer 201 has two parts where the reset line RST overlaps. Thus, the initialization transistor is of a double-gate structure, and the second bending part LZ2 is disposed in an "n" shape, so that it is easier to form a double-gate structure with the reset line RST. Moreover, the first bending part LZ1 is disposed as follows: one end is the first conductive region 201a of the first active layer 201, and the other end is bent toward a side facing away from the data signal line VD, so that more space can be reserved for the second bending part LZ2, and the first bending part LZ1 and the second bending part LZ2 are far away from the first conductive region 203a of the third active layer 203.

Specifically, as shown in FIG. 11, the distance between the first conductive region 201a of the first active layer 201 and the first conductive region 203a of the third active layer 203 in the second direction F2 is d1, and the distance between any point at the edge of the first bending part LZ1 and the first conductive region 203a of the third active layer 203 in the second direction F2 is d2. As is apparent from the figure, d2 is larger than d1, that is, the distance between the first bending part LZ1 and the first conductive region 203a of the third active layer 203 is long.

Optionally, in the above-described display panel provided according to the embodiments of the present disclosure, as shown in FIG. 11, the second active layer 202 includes: a first branch part FZ1 and a second branch part FZ2.

One end of the first branch part FZ1 is a first conductive region 202a of the second active layer 202, and the other end of the first branch part FZ1 is connected to the second branch part FZ2.

The first branch part FZ1 extends in the second direction F2, and the second branch part FZ2 extends in the first direction F1.

By arranging the first conductive region 202a of the second active layer 202 on a side, facing away from the first active layer 201, of the first branch part FZ1, connection between the first conductive region 202a of the second active layer 202 and the initialization signal line VINIT is more facilitated, and by arranging the first branch part FZ1 on a side, facing away from the first active layer 201, of the second branch part FZ2, more space is left for the first active layer 201. The second branch part FZ2 is disposed to extend in the first direction F1, thereby facilitating connection with the sixth active layer 206.

In a specific implementation, in the above-described display panel provided according to the embodiments of the present disclosure, as shown in FIG. 11, the third active layer 203 includes: a conductive protrusion part TQ, and a conductive extension part YS extending in the first direction F1.

One end of the conductive protrusion part TQ is the first conductive region 203a of the third active layer 203, and the other end is connected to the conductive extension part YS.

As shown in FIGS. 14 and 15, the second conductive layer 22 further includes: the scan line GA extending in the second direction F2, the gate of the data writing transistor is a part where the scan line GA overlaps the third active layer 203, and the conductive extension part YS is disposed to extend in the first direction F1, so that the third active layer 203 can have an overlapping part with the scan line GA. By arranging the conductive protrusion part TQ, electric connection of the first conductive region 203a and the data signal line VD is facilitated, and the conductive protrusion part TQ may be disposed on a side, close to the first active layer 201, of the conductive extension part YS or on a side, away from the first active layer 201, of the conductive extension part YS, which is not limited thereto.

In addition, as shown in FIG. 11, the semiconductor layer 20 further includes: a fourth active layer 204 of the drive transistor T4, a fifth active layer 205 of the first light emitting control transistor, the sixth active layer 206 of the second light emitting control transistor, and a seventh active layer 207 of the threshold compensation transistor. Each active layer in the semiconductor layer 20 includes the first conductive region, the second conductive region, and the channel region. The channel region is located between the first conductive region and the second conductive region. Optionally, the first conductive region serves as a source electrode of each transistor, and the second conductive region serves as a drain electrode of each transistor; or, the first conductive region serves as the drain electrode of each transistor, and the second conductive region serves as the source electrode of each transistor, which is not limited thereto. In addition, each active layer in the semiconductor layer 20 may be integrally disposed.

In a specific implementation, the connected active layers shares a common conductive region, for example, as shown in FIG. 11, the first active layer 201 and the second active layer 202 share a common conductive region b1, for another example, the third active layer 203, the fourth active layer 204, and the fifth active layer 205 share a common conductive region b2, and further, other active layers may share a common conductive region, which will not be described again.

Specifically, the semiconductor layer 20 may be made of amorphous silicon, polysilicon, an oxide semiconductor material, or the like. It should be noted that the first conductive region and the second conductive region described above may be regions doped with n-type impurities or p-type impurities.

Illustratively, as shown in FIGS. 14 and 15, the second conductive layer 22 may include a second electrode c2 of the storage capacitor CST, the scan line GA, the reset line RST, the light emitting control line EM, the drive gate G1 of the drive transistor, the gate of the data writing transistor, the gate of the threshold compensation transistor, the gate of the first light emitting control transistor, the gate of the second light emitting control transistor, the gate of the initialization transistor, and the gate of the reset transistor, where the drive gate G1 of the drive transistor may be the second electrode c2 of the storage capacitor CST.

For example, as shown in conjunction with FIGS. 7 and 11, the gate of the data writing transistor may be a part where the scan line GA overlaps the third active layer, the gate of the first light emitting control transistor may be a part where the light emitting control line EM overlaps the fifth active layer 205, the gate of the second light emitting control transistor may be a part where the light emitting control line EM overlaps the sixth active layer 206, the gate of the initialization transistor may be a part where the reset line RST overlaps the first active layer 201, the gate of the threshold compensation transistor may be a part where the reset line RST overlaps the second active layer 202, the threshold compensation transistor may be a thin film transistor of a double gate structure, a first gate of the threshold compensation transistor may be a part where the scan line GA overlaps the seventh active layer 207, and a second gate of the threshold compensation transistor may be a part where the protrusion part protruding from the scan line GA overlaps the seventh active layer 207.

Illustratively, as shown in FIG. 15, the scan line GA, the reset line RST, and the light emitting control line EM are disposed in the first direction F1. The scan line GA, the reset line RST and the light emitting control line EM extend substantially in the second direction F2. Illustratively, the scan line GA is located between the reset line RST and the light emitting control line EM.

Illustratively, in the first direction F1, the second electrode c2 of the storage capacitor CST is located between the scan line GA and the light emitting control line EM. Also, the protrusion part protruding from the scan line GA is located at a side, away from the light emitting control line EM, of the scan line GA.

Illustratively, referring to FIGS. 16 and 17, the third conductive layer 13 includes the first electrode c1 of the storage capacitor CST, the initialization signal line VINIT, the shielding structure 231, and the conductive connection structure 232, where the first electrode c1 of the storage capacitor CST at least partially overlaps the second electrode c2 of the storage capacitor CST to form the storage capacitor CST.

Figure 20:
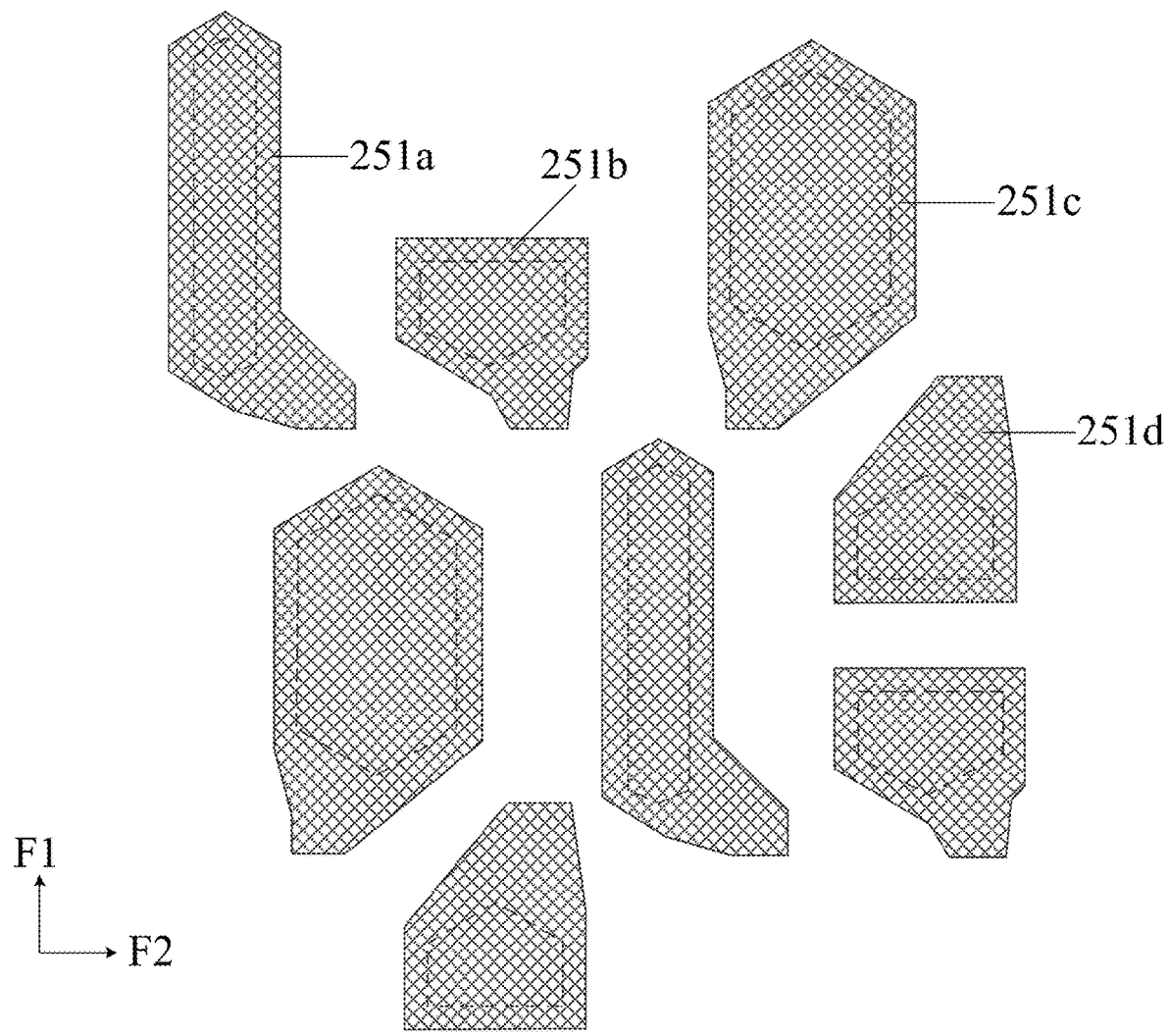
FIG. 20 is a schematic top view of a fifth conductive layer corresponding to a plurality of sub-pixels.

FIG. 20 is a schematic top view of a fifth conductive layer in an embodiment of the present disclosure. As shown in FIG. 20, a plurality of anodes in the fifth conductive layer may be divided into a first anode 251a, a second anode 251b, a third anode 251c, and a fourth anode 251d. Accordingly, the plurality of sub-pixels in the display panel may be divided into a plurality of repeating units, each of which may include a first sub-pixel, a second sub-pixel, a third sub-pixel and a fourth sub-pixel, wherein the first sub-pixel may include the first anode 251a, the second sub-pixel may include the second anode 251b, the third sub-pixel may include the third anode 251c, and the fourth sub-pixel may include the fourth anode 251d. In a specific implementation, the number of the sub-pixels in each repeating structure may be other numerical values, which is not limited thereto.

In practical application, in the above-described display panel provided according to the embodiment of the present disclosure, as shown in FIG. 1, the plurality of sub-pixels spx in the display panel are arrayed in the first direction F1 and the second direction F2.

Referring to FIG. 12 at the same time, the display panel includes a plurality of data signal lines, and the data signal lines are divided into first data signal lines VD1 and second data signal lines VD2.

In each column of sub-pixels spx, the sub-pixels spx of the odd rows share one first data signal line VD1 and the sub-pixels spx of the even rows share one second data signal line VD2, for example, in FIG. 1, in the first column of sub-pixels spx, the first, third and fifth sub-pixels spx are connected to the first data signal line VD1 and the second, fourth and sixth sub-pixels spx are connected to the second data signal line VD2.

For a high refresh rate display panel, an increase in refresh rate compresses the data signal write time for each row of sub-pixels (e.g., the row of sub-pixels disposed in the second direction F2 in FIG. 1), each column of sub-pixels spx are set as follows: the sub-pixels spx of the odd rows share the first data signal lines VD1, the sub-pixels spx of the even rows share the second data signal line VD2, and in the driving process, the sub-pixels of the odd rows and the sub-pixels of the even rows can be respectively driven, so that the problem that the data writing time of the sub-pixels of each row is insufficient during high frame rate display is solved. It should be noted that in the embodiments of the present disclosure, the second direction F2 is the row direction and the first direction F1 is the column direction, and in a specific implementation, the first direction F1 may be used as the row direction and the second direction F2 as the column direction, which is not limited thereto.

In a specific implementation, the display panel may include sub-pixels spx of multiple colors, such as sub-pixels spx of three colors like red, green, and blue, or may include sub-pixels spx of four colors, or sub-pixels of more colors, which is not limited thereto. The plurality of sub-pixels spx in the display panel may be neatly disposed as shown in FIG. 1 or may be disposed such that adjacent columns of the sub-pixels are staggered by a certain distance, and the arrangement mode of the sub-pixels is not limited.

Based on the same inventive concept, the embodiment of the present disclosure also provides a display device. The display device includes the above-described display panel, and the display device may be applied to any product or component with a display function, such as a mobile phone, a tablet computer, a television, a display, a notebook computer, a digital photo frame, a navigator and the like. Since the principle by which the display device solves the problem is similar to that of the above-described display panel, the implementation of the display device can be referred to the implementation of the above-described display panel, and a detailed description thereof will be omitted.

According to the display panel and the display device provided by the embodiments of the present disclosure, the first active layer is disposed on one side, away from the data signal line, of the second active layer, so that the distance between the first active layer connected to the drive gate and the third active layer connected to the data signal line is increased, the influence of the data signal line on the drive gate of the drive transistor is relieved, and the display effect of the display panel is improved.

Although preferred embodiments of the present disclosure have been described, additional variations and modifications of these embodiments will occur to those skilled in the art upon attaining the basic inventive concept. It is therefore intended that the appended claims be interpreted as including the preferred embodiments and all such alterations and modifications as fall within the true scope of the present disclosure.

It will be apparent to those skilled in the art that various modifications and variations can be made in the embodiments of the present disclosure without departing from the spirit or scope of the embodiments of the present disclosure. Thus, it is intended that the present disclosure covers the modifications and variations of this embodiment provided they come within the scope of the appended claims and their equivalents.

What is claimed is:

1. A display panel, comprising:
    a base substrate; and
    a plurality of sub-pixels located on the base substrate;
    wherein each of the plurality of sub-pixels comprises:
        a semiconductor layer located on the base substrate and comprising:
            a first active layer of an initialization transistor,
            a second active layer of a reset transistor, and
            a third active layer of a data writing transistor;
        a first conductive layer located on a side, facing away from the base substrate, of the semiconductor layer and comprising: a data signal line extending in a first direction; and
        a second conductive layer located on the base substrate and comprising: a drive gate of a drive transistor;
        wherein the drive gate is electrically connected to a first conductive region of the first active layer;
        the data signal line is electrically connected to a first conductive region of the third active layer; and
        an orthographic projection of the second active layer on the base substrate is located between an orthographic projection of the first active layer on the base substrate and an orthographic projection of the data signal line on the base substrate.

2. The display panel according to claim 1, wherein an orthographic projection of a channel region of the second active layer on the base substrate is located between an orthographic projection of a channel region of the first active layer on the base substrate and the orthographic projection of the data signal line on the base substrate.

3. The display panel according to claim 1, further comprising: a third conductive layer located on the base substrate, wherein
    the third conductive layer comprises: an initialization signal line extending in a second direction; and the second direction is intersected with the first direction;
    the initialization signal line is electrically connected with a first conductive region of the second active layer; and
    the first conductive region of the second active layer is located at an end, facing away from the first active layer, of the second active layer.

4. The display panel according to claim 3, further comprising: a shielding structure located on the base substrate, wherein
    an orthographic projection of the shielding structure on the base substrate is located between an orthographic projection of the first conductive region of the first active layer on the base substrate and an orthographic projection of the first conductive region of the third active layer on the base substrate.

5. The display panel according to claim 4, further comprising: a fourth conductive layer located on a side, facing away from the base substrate, of the semiconductor layer, wherein
    the fourth conductive layer comprises: a fixed potential signal line extending in the first direction; and
    the shielding structure is electrically connected to the fixed potential signal line.

6. The display panel according to claim 4, wherein the shielding structure is disposed on the same layer as the initialization signal line.

7. The display panel according to claim 6, wherein the third conductive layer further comprises: a conductive connection structure connected to the shielding structure; and
    a fixed potential signal line is electrically connected to the shielding structure through the conductive connection structure.

8. The display panel according to claim 5, wherein the fourth conductive layer further comprises: a first conductive connection part, a second conductive connection part and a third conductive connection part which are insulated from one another;

the drive gate is electrically connected to the first conductive region of the first active layer through the first conductive connection part;

the data signal line is electrically connected to the first conductive region of the third active layer through the second conductive connection part; and the initialization signal line is electrically connected to the first conductive region of the second active layer through the third conductive connection part.

9. The display panel according to claim 1, wherein the first active layer comprises: a first bending part and a second bending part;

one end of the first bending part is the first conductive region of the first active layer, and the other end of the first bending part is connected to the second bending part and bent towards one side facing away from the data signal line; and the second bending part is n-shaped, one end of the second bending part is connected to the first bending part, and the other end of the second bending part is connected to the second active layer.

10. The display panel according to claim 3, wherein the second active layer comprises: a first branch part and a second branch part;

one end of the first branch part is the first conductive region of the second active layer, and the other end of the first branch part is connected to the second branch part; and the first branch part extends in the second direction, and the second branch part extends in the first direction.

11. The display panel according to claim 1, wherein the third active layer comprises:

a conductive protrusion part and a conductive extension part extending in the first direction; and one end of the conductive protrusion part is the first conductive region of the third active layer, and the other end of the conductive protrusion part is connected to the conductive extension part.

12. The display panel according to claim 1, wherein the plurality of sub-pixels in the display panel are arrayed in the first direction and a second direction;

the display panel comprises a plurality of data signal lines, and the data signal lines are divided into first data signal lines and second data signal lines; and in each column of the sub-pixels, the sub-pixels of odd rows share one first data signal line, and the sub-pixels of even rows share one second data signal line.

13. A display device, comprising: a display panel, wherein the display panel comprises:

a base substrate; and a plurality of sub-pixels located on the base substrate;

wherein each of the plurality of sub-pixels comprises:

a semiconductor layer located on the base substrate and comprising:

a first active layer of an initialization transistor, a second active layer of a reset transistor, and a third active layer of a data writing transistor;

a first conductive layer located on a side, facing away from the base substrate, of the semiconductor layer and comprising: a data signal line extending in a first direction; and a second conductive layer located on the base substrate and comprising: a drive gate of a drive transistor;

wherein the drive gate is electrically connected to a first conductive region of the first active layer;

the data signal line is electrically connected to a first conductive region of the third active layer; and an orthographic projection of the second active layer on the base substrate is located between an orthographic projection of the first active layer on the base substrate and an orthographic projection of the data signal line on the base substrate.

\* \* \* \* \*